(12) United States Patent
Hill

(10) Patent No.: US 12,369,380 B2
(45) Date of Patent: *Jul. 22, 2025

(54) TRANSISTOR WITH DIELECTRIC SPACERS AND FIELD PLATE AND METHOD OF FABRICATION THEREFOR

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 629 days.

This patent is subject to a terminal disclaimer.

(21) Appl. No.: 17/661,834

(22) Filed: May 3, 2022

(65) Prior Publication Data

US 2023/0361183 A1    Nov. 9, 2023

(51) Int. Cl.

| | |
|---|---|
| H01L 21/02 | (2006.01) |
| H01L 21/311 | (2006.01) |
| H01L 21/76 | (2006.01) |
| H01L 21/765 | (2006.01) |
| H01L 23/48 | (2006.01) |
| H10D 30/01 | (2025.01) |
| H10D 30/47 | (2025.01) |
| H10D 62/85 | (2025.01) |
| H10D 64/00 | (2025.01) |
| H10D 64/01 | (2025.01) |

(52) U.S. Cl.
CPC ....... *H10D 64/118* (2025.01); *H01L 21/0217* (2013.01); *H01L 21/02178* (2013.01); *H01L 21/31116* (2013.01); *H01L 21/7605* (2013.01); *H01L 21/765* (2013.01); *H01L 23/481* (2013.01); *H10D 30/015* (2025.01); *H10D 30/475* (2025.01); *H10D 62/8503* (2025.01); *H10D 64/01* (2025.01); *H10D 64/111* (2025.01)

(58) Field of Classification Search
None
See application file for complete search history.

(56) References Cited

U.S. PATENT DOCUMENTS

| | | | |
|---|---|---|---|
| 6,040,214 A | 3/2000 | Boyd et al. | |
| 9,142,636 B2 | 9/2015 | Sheppard et al. | |
| (Continued) | | | |

OTHER PUBLICATIONS

U.S. Appl. No. 17/645,286; not yet published; 36 pages (Dec. 20, 2021).

(Continued)

*Primary Examiner* — Kyoung Lee
(74) *Attorney, Agent, or Firm* — Andrew C. Milhollin

(57) ABSTRACT

A transistor device includes a semiconductor substrate and a gate structure formed over the substrate. Forming the gate structure may include steps of forming a multi-layer dielectric stack over the substrate, performing an anisotropic dry etch of the multi-layer dielectric stack to form a gate channel opening, forming a conformal dielectric layer over the substrate, performing an anisotropic dry etch of the conformal dielectric layer to form dielectric sidewalls in the gate channel opening, etching portions of dielectric layers in a gate channel region, and forming gate metal in the gate channel region. Dielectric spacers may be similarly formed in a field plate channel opening prior to formation of a field plate of the transistor. By forming dielectric spacers in the gate channel opening, the length of the gate structure can be advantageously decreased.

18 Claims, 33 Drawing Sheets

(56) References Cited

U.S. PATENT DOCUMENTS

| | | |
|---|---|---|
| 2002/0090792 A1 | 7/2002 | Wu et al. |
| 2019/0326412 A1 | 10/2019 | Behammer |
| 2021/0111254 A1* | 4/2021 | Jones .................... H01L 29/407 |
| 2021/0184005 A1 | 6/2021 | Liu |
| 2022/0130966 A1 | 4/2022 | Bothe et al. |

OTHER PUBLICATIONS

Non Final Offie Action: U.S. Appl. No. 17/661,827 21 pages (Sep. 17, 2024).

* cited by examiner

TRANSISTOR WITH DIELECTRIC SPACERS AND FIELD PLATE AND METHOD OF FABRICATION THEREFOR

TECHNICAL FIELD

Embodiments of the subject matter described herein relate generally to transistor devices, and more particularly to dielectric spacers in gate channels of semiconductor power transistors.

BACKGROUND

High-power field effect transistor (FET) devices find application in a wide variety of electronic components and systems. While various advances have been made to improve gain, efficiency, and other characteristics of power FETs that are used to provide amplification in radio frequency (RF) communication systems, challenges still exist for fabricating such devices. For example, fabricating FETs with short gate lengths using photolithography alone is more challenging for gallium nitride (GaN) on silicon carbide (SiC) based FETs than for silicon (Si) based FETs, due in part to transparency of SiC substrates and to lack of sufficiently uniform flatness of GaN-on-SiC substrates due to, for example, side effects of heteroepitaxy (used to grow GaN on SiC). As another example, conventional anisotropic dry etch techniques allow for vertical sidewalls to be formed when etching material during fabrication of a FET device. However, ion bombardment typically used in such techniques can damage sensitive surfaces of the material being etched or of material beneath the material being etched due to over-etching.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

SUMMARY

Figure 1A:
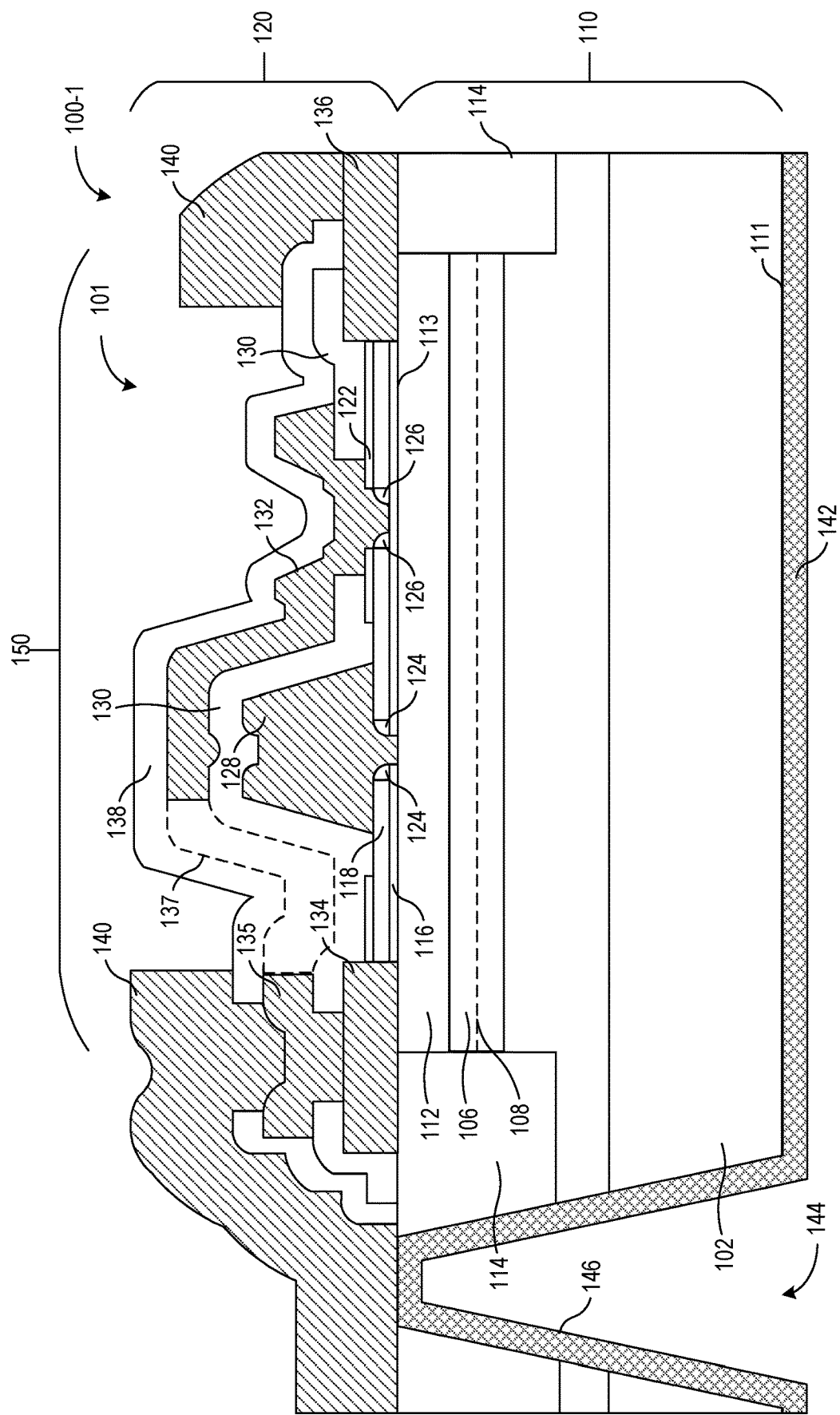
FIGS. 1A, 1B, 1C, 1D, and 1E are cross sectional side views of respective transistor devices, in accordance with various embodiments.

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a transistor device includes a semiconductor substrate having an upper surface, a multi-layer dielectric stack disposed at the upper surface of the semiconductor substrate, a gate electrode at the upper surface of the semiconductor substrate, at least a portion of the gate electrode being disposed in a first channel region formed in the multi-layer dielectric stack, a field plate that is disposed over the semiconductor substrate, and first dielectric spacers interposed between the portion of the gate electrode and first sidewalls of the first channel region. The multi-layer dielectric stack may include at least a first dielectric layer, a second dielectric layer, and a third dielectric layer. The second dielectric layer may be interposed between the first dielectric layer and the third dielectric layer. The first dielectric layer and the third dielectric layer may each have high etch selectivity with respect to the second dielectric layer.

In some embodiments, the transistor device includes an interlayer dielectric layer disposed over the gate electrode and the multi-layer dielectric stack.

In some embodiments, the field plate is disposed over the interlayer dielectric layer.

In some embodiments, the field plate is at least partially disposed in a field plate opening in the interlayer dielectric layer.

In some embodiments, the field plate is at least partially disposed in a second channel region in the multi-layer dielectric stack and the opening in the interlayer dielectric layer overlaps the second channel region.

In some embodiments, the transistor device includes second dielectric spacers disposed in the second channel region. The second dielectric spacers may each be interposed between second sidewalls of the second channel region and a portion of the field plate.

In some embodiments, the second dielectric spacers each have high etch selectivity with respect to the interlayer dielectric layer.

In some embodiments, the transistor device may include a field plate dielectric layer disposed in the second channel region between at least the field plate and the upper surface of the semiconductor substrate.

In some embodiments, the first dielectric layer and the third dielectric layer each include aluminum oxide and the second dielectric layer includes silicon nitride.

In some embodiments, a method of fabricating a transistor device includes steps of providing a substrate that includes an upper surface, forming a multi-layer dielectric stack on the upper surface of the substrate, the multi-layer dielectric stack including a first dielectric layer, a second dielectric layer, and a third dielectric layer, selectively etching a first region of the multi-layer dielectric stack to form a gate channel opening that extends through at least the second dielectric layer and the third dielectric layer, forming first dielectric spacers in the gate channel opening over the first dielectric layer, selectively etching a portion of the first dielectric layer such that the gate channel opening extends through the first dielectric layer, forming a gate electrode in the gate channel opening, forming an interlayer dielectric layer over the gate electrode, and forming a field plate over the interlayer dielectric layer. The second dielectric layer may be interposed between the first dielectric layer and the third dielectric layer. The first dielectric layer and the third dielectric layer may each have high etch selectivity with respect to the second dielectric layer;

In some embodiments, the method includes a step of etching the interlayer dielectric layer to form an opening in the interlayer dielectric layer. Forming the field plate may include a step of forming the field plate over the interlayer dielectric layer and at least partially in the opening in the interlayer dielectric layer.

In some embodiments, the method includes a step of selectively etching a second region of the multi-layer dielectric stack to form a field plate channel opening that extends through at least the third dielectric layer. The step of forming the field plate may include forming the field plate over the interlayer dielectric layer, at least partially in the opening in the interlayer dielectric layer, and at least partially in the field plate channel opening.

In some embodiments, the method includes a step of forming a field plate dielectric layer in the field plate channel opening prior to forming the field plate.

In some embodiments, the method includes a step of forming second dielectric spacers in the field plate channel opening concurrently with forming the first dielectric spacers in the gate channel opening by forming a conformal dielectric layer over the multi-layer dielectric stack and at least partially in the gate channel opening and the field plate channel opening and etching the conformal dielectric layer. The first dielectric spacers may include first portions of the conformal dielectric layer remaining in the gate channel opening after etching the conformal dielectric layer. The second dielectric spacers may include second portions of the conformal dielectric layer remaining in the field plate channel opening after etching the conformal dielectric layer.

In some embodiments, the first dielectric spacers and the second dielectric spacers each have high etch selectivity with respect to the third dielectric layer.

In some embodiments, the first dielectric spacers and the second dielectric spacers each have high etch selectivity with respect to the interlayer dielectric layer.

In some embodiments, the steps of selectively etching the first region of the multi-layer dielectric stack to form a gate channel opening and selectively etching the second region of the multi-layer dielectric stack to form the field plate channel opening include a step of performing an anisotropic dry etch process to selectively etch at least the second dielectric layer to form the gate channel opening in the first region of the multi-layer dielectric stack and to form the field plate channel opening in the second region of the multi-layer dielectric stack.

In some embodiments, the method includes a step of forming one or more straps that electrically couple the field plate to a source electrode of the transistor device.

In some embodiments, at least a portion of the gate electrode is interposed between the first dielectric spacers in the gate channel opening and contacts the upper surface of the substrate.

In some embodiments, the first dielectric layer and the third dielectric layer each comprise aluminum oxide and the second dielectric layer comprises silicon nitride.

DETAILED DESCRIPTION

Various embodiments described herein address the above challenges by providing a power transistor and an associated fabrication method in which a gate channel opening and field plate channel opening are formed in a multi-layer (e.g., three-layer) dielectric stack disposed on a substrate and having a stop etch layer that protects a surface of the substrate, and dielectric spacers are formed in at least the gate channel opening, which reduce the gate length of a gate of the power transistor. For example, the gate channel opening and the field plate channel opening may be formed via anisotropic dry etching of the multi-layer dielectric stack, with at least one dielectric layer of the multi-layer dielectric stack protecting a surface of the substrate during ion bombardment associated with the anisotropic dry etch. The dielectric spacers may be formed at interior sidewalls of the gate channel opening to reduce the gate length of a gate of the power transistor. Such an approach may allow shorter gate lengths to be achieved than would otherwise be achievable using photolithography alone (due, at least in part, to reduction in gate length by the dielectric spacers), while mitigating damage the surface of the substrate of the power transistor, which may otherwise be caused by anisotropic dry etching. In some embodiments, additional dielectric spacers are formed at interior sidewalls of the field plate channel opening, which may provide additional design flexibility for the power transistor.

FIGS. 1A, 1B, 1C, 1D, and 1E are cross sectional side views of embodiments of a transistor device 100 (transistor devices 100-1, 100-2, 100-3, 100-4, 100-5, respectively). Each transistor device 100 includes a semiconductor die having a base semiconductor substrate 110 and an overlying build-up structure 120. The substrate 110 is defined by an upper surface 113 and a lower surface 111, along with sidewalls that extend between the lower and upper substrate surfaces 111, 113. A plurality of additional electrical structures, patterned conductive layers, and dielectric layers are included in the build-up structure 120, which is connected to and overlies the upper surface 113 of the substrate 110.

In some embodiments, an active region 150 is defined within a portion of the substrate 110 and an overlying portion of the build-up structure 120. One or more isolation regions 114 may be defined within the substrate 110 at the upper surface 113, and the active region 150 corresponds to portions of the substrate 110 extending between at least two of the isolation regions 114.

In some embodiments, the semiconductor substrate 110 may include a host semiconductor substrate 102 and a plurality of layers overlying the host substrate 102. According to an embodiment, the plurality of layers overlying the host substrate 102 includes a buffer layer 104, a channel layer 106, and a barrier layer 112, all of which are described in more detail below.

In some embodiments, the build-up structure 120 is formed on and over the upper surface 113 of the substrate 110 and may include various electrical structures (e.g., gate electrode 128, source and drain electrodes 134, 136), a plurality of dielectric layers (e.g., dielectric layers 116, 118, 122, 130, 138, and/or 148), and a plurality of patterned conductive layers (e.g., source metallization 135, a field plate 132, an interconnect layer 140).

In some embodiments, a backside metal layer 142 is formed on the lower surface 111 of the substrate 110. The backside metal layer 142 may be electrically connected to conductive material 146 formed in a through substrate via (TSV) 144, which electrically connects the backside metal layer 142 to the interconnect layer 140 at the upper surface 113 of the substrate 110.

A transistor 101 is formed in the active region 150 of the transistor device 100. In various embodiments, the transistor 101 is a field effect transistor (FET), which includes a gate electrode 128, a source electrode 134 proximate to but spaced apart from a first sidewall of the gate electrode 128, and a drain electrode 136 proximate to but spaced apart from a second sidewall of the gate electrode 128, all of which are present at the upper surface 113 of the substrate 110 and are formed in the build-up structure 120 overlying the substrate 110. In some embodiments, the transistor 101 is a high electron mobility transistor (HEMT), although the transistor 101 may be another type of transistor in one or more other embodiments. In some embodiments, the transistor 101 is a gallium nitride (GaN) HEMT.

The source and drain electrodes 134, 136 (also referred to as first and second current-carrying electrodes) are formed at and over the upper surface 113 of the substrate 110. In some embodiments, the source and drain electrodes 134, 136 make ohmic contact with the substrate 110. For example, the source electrode 134 and the drain electrode 136 may be formed laterally adjacent each other, and both of the source electrode 134 and the drain electrode 136 extend through dielectric layers 116, 118, 122 (sometimes referred to as a first dielectric layer 116, second dielectric layer 118, and third dielectric layer 122) to make contact with the upper surface 113 of the substrate 110. In addition, the source and drain electrodes 134, 136 may be electromagnetically coupled to opposite ends of a channel 108, which is present within the channel layer 106 of the substrate 110. The source electrode 134 may be electrically coupled to the TSV 144 and the backside metal layer 142 through patterned portions of one or more of the interconnect metal layers (e.g., source metallization 135, interconnect layer 140) of the build-up structure 120. The drain electrode 136 is electrically coupled to an output (not shown) of the transistor device 100 via the interconnect layer 140, for example.

The gate electrode 128 (also referred to as a "control electrode") may be a metallic structure, which is electromagnetically coupled to the channel 108 in one or more embodiments. In one or more other embodiments, the gate electrode 128 may include non-metallic material, such as polysilicon as a non-limiting example. According to an embodiment, the gate electrode 128 extends through the dielectric layers 116, 118, 122 to contact the upper surface 113 of the substrate 110 between the source and drain electrodes 134, 136. The opening through the dielectric layers 116, 118, 122 in which portions the gate electrode 128 is formed is sometimes referred to as the "gate channel opening" herein. The region of the build-up structure 120 at which the gate electrode 128 is formed is sometimes referred to as the "gate channel region" herein. In some embodiments, the gate electrode 128 includes a Schottky contact connected to the substrate 110.

In some embodiments, the build-up structure 120 includes the dielectric layers 116, 118, 122 formed over the upper surface 113 of the substrate 110, an interlayer dielectric (ILD) layer 130 formed over portions of the gate electrode 128 and the dielectric layers 116, 118, 122, a field plate 132 formed over at least portions of the dielectric layers 116, 118, 122 and the ILD layer 130 (also overlapping portions of the gate electrode 128), and a dielectric layer 138 formed over portions of the field plate 132 and the ILD layer 130. As mentioned above, the gate electrode 128 may extend through openings in the dielectric layers 116, 118, 122. Each of the gate electrode 128, the source electrode 134, and the drain electrode 136 contact the upper surface 113 of the substrate 110 at various points above the channel 108. In some embodiments, the first dielectric layer 116 may have a thickness in a range of about 10 angstroms to about 500 angstroms, the second dielectric layer 118 may have a thickness in a range of about 100 angstroms to about 1500 angstroms, and the third dielectric layer 122 may have a thickness in a range of about 10 angstroms to about 500 angstroms, although other thickness values may be used. Further, according to an embodiment, each of the dielectric layers 116, 118, 122 are formed from respective dielectric materials, such as aluminum oxide ($Al_2O_3$), silicon nitride (SiN; sometimes given as $Si_3N_4$), silicon oxide ($SiO_2$), silicon oxynitride (SiON), aluminum nitride (AlN), silicon aluminum nitride (SiAlN), hafnium oxide ($HfO_2$), zirconium oxide ($ZrO_2$), titanium oxide ($TiO_2$), or other suitable materials.

In some embodiments, the first dielectric layer 116 and the third dielectric layer 122 may each include a first dielectric material and the second dielectric layer 118 may include a second dielectric material that is different from the first dielectric material. For example, the first dielectric material may have a different etch rate than the second dielectric material (e.g., with respect to one or more wet etch and/or anisotropic dry etch processes). In other words, the first dielectric material may have high etch selectivity with respect to the second dielectric material. For example, the first dielectric material may be AN, and the second dielectric material may be SiN. In some embodiments, the dielectric layers 116, 118, 122 are deposited on the substrate 110 using respective chemical vapor deposition processes, such as low-pressure chemical vapor deposition (LPCVD).

First dielectric spacers 124 (sometimes referred to as "inside spacers", "inner spacers" or "gate spacers") may be disposed in the gate channel opening in which the gate electrode 128 is formed. For example, the first dielectric spacers 124 may be disposed over the first dielectric layer 116 and adjacent to and in contact with portions of the second dielectric layer 118 (corresponding to sidewalls of the gate channel opening/gate channel region, for example). As will be described, the first dielectric spacers 124 may reduce the gate length of the gate electrode 128 (e.g., to a gate length that is smaller than that achievable by conventional photolithographic equipment and techniques).

The field plate 132 may be formed from portions of a first conductive layer that overlies portions of the dielectric layers 116, 118, 122 and the ILD layer 130. The source metallization 135 may also be formed from the first conductive layer. At various points above the channel 108 (along a dimension extending directly into the page, from the perspective of the present example), straps of conductive material are formed in a region 137 to electrically connect the field plate 132 to the source metallization 135. At other points above the channel 108, dielectric material from the dielectric layer 138 may instead be formed in the region 137. The straps of conductive material formed in the region 137 (in conjunction with the source metallization 135 and the interconnect layer 140) electrically couple the field plate 132 to the source electrode 134 and the conductive material 146 of the TSV 144.

The region of the build-up structure 120 at which the field plate 132 is formed is sometimes referred to as the "field plate region" herein. The field plate 132 may be formed in proximity to the gate electrode 128. The field plate 132 may be formed from a first electrically conductive material (e.g., titanium tungsten (TiW), titanium tungsten nitride (TiWN), tungsten silicide (WSi), or other suitable materials). In some embodiments, as shown in the present example, at least some portions of the field plate 132 overlie the gate electrode 128, and thus are proximate to the sidewalls and the upper surface of the gate electrode 128, with portions of the ILD layer 130 being present between the field plate 132 and the gate electrode 128. In other embodiments, no portion of the field plate 132 overlies the gate electrode 128.

Figure 1B:
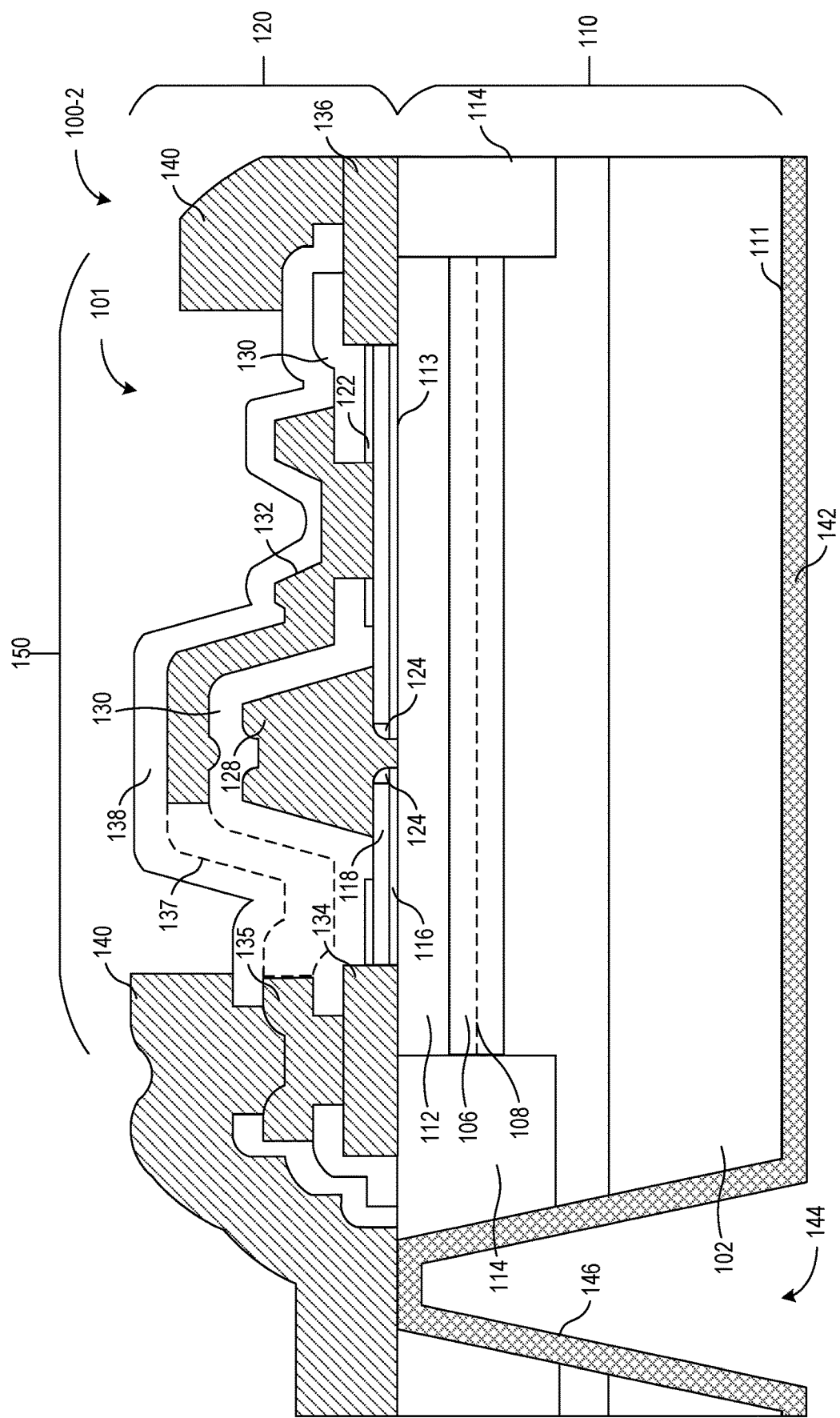
Figure 1C:
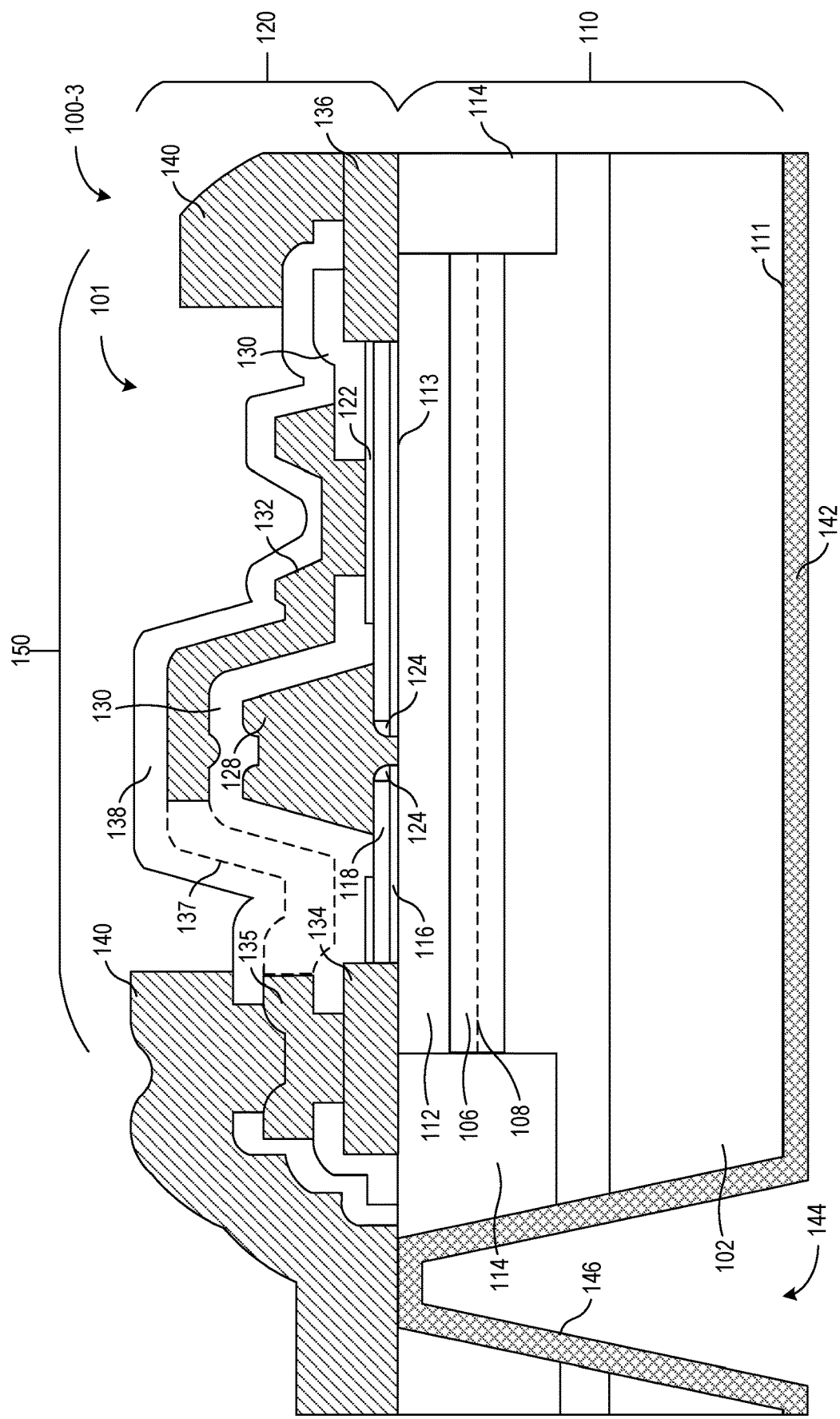
Figure 1D:
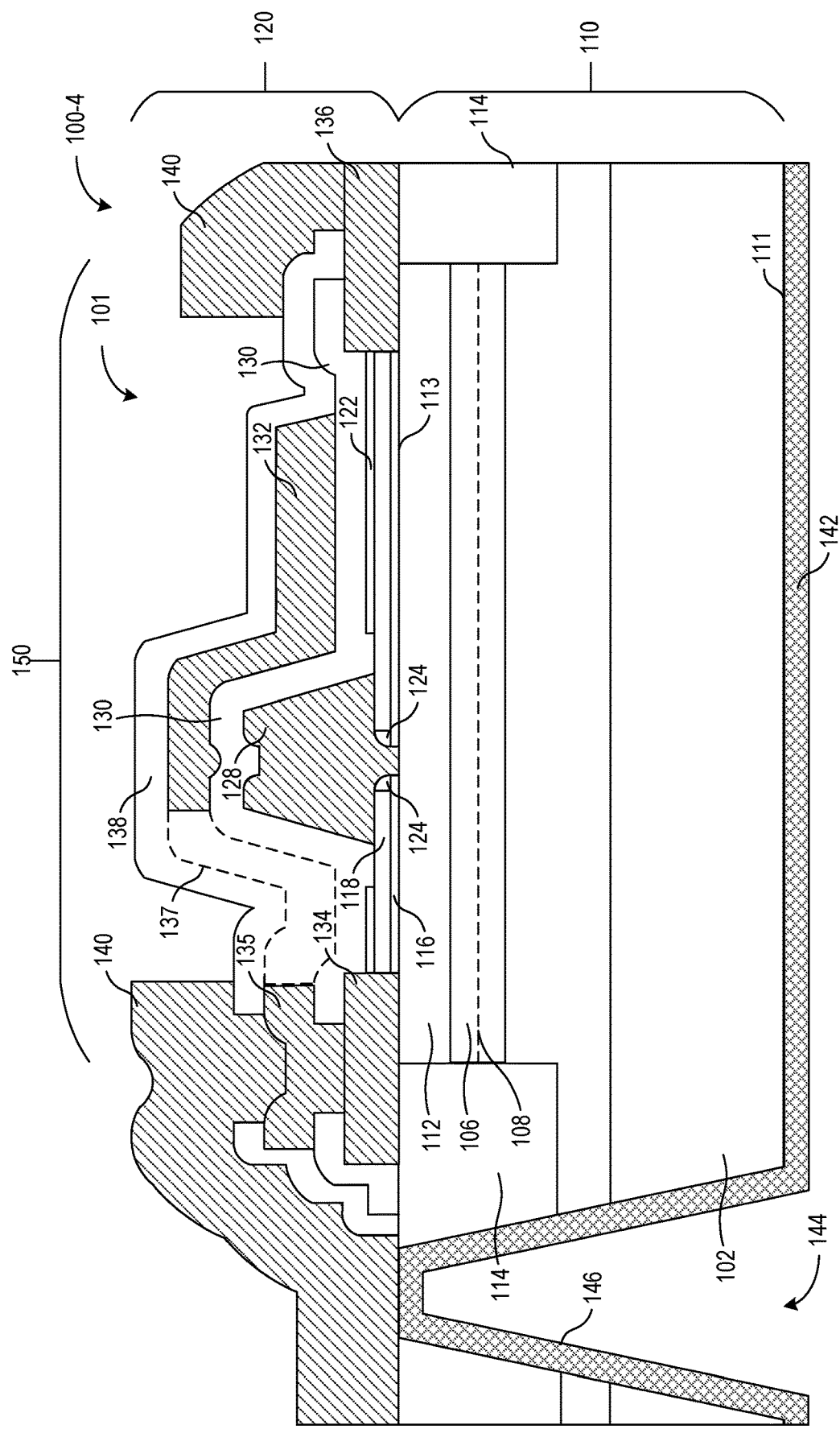
Figure 1E:
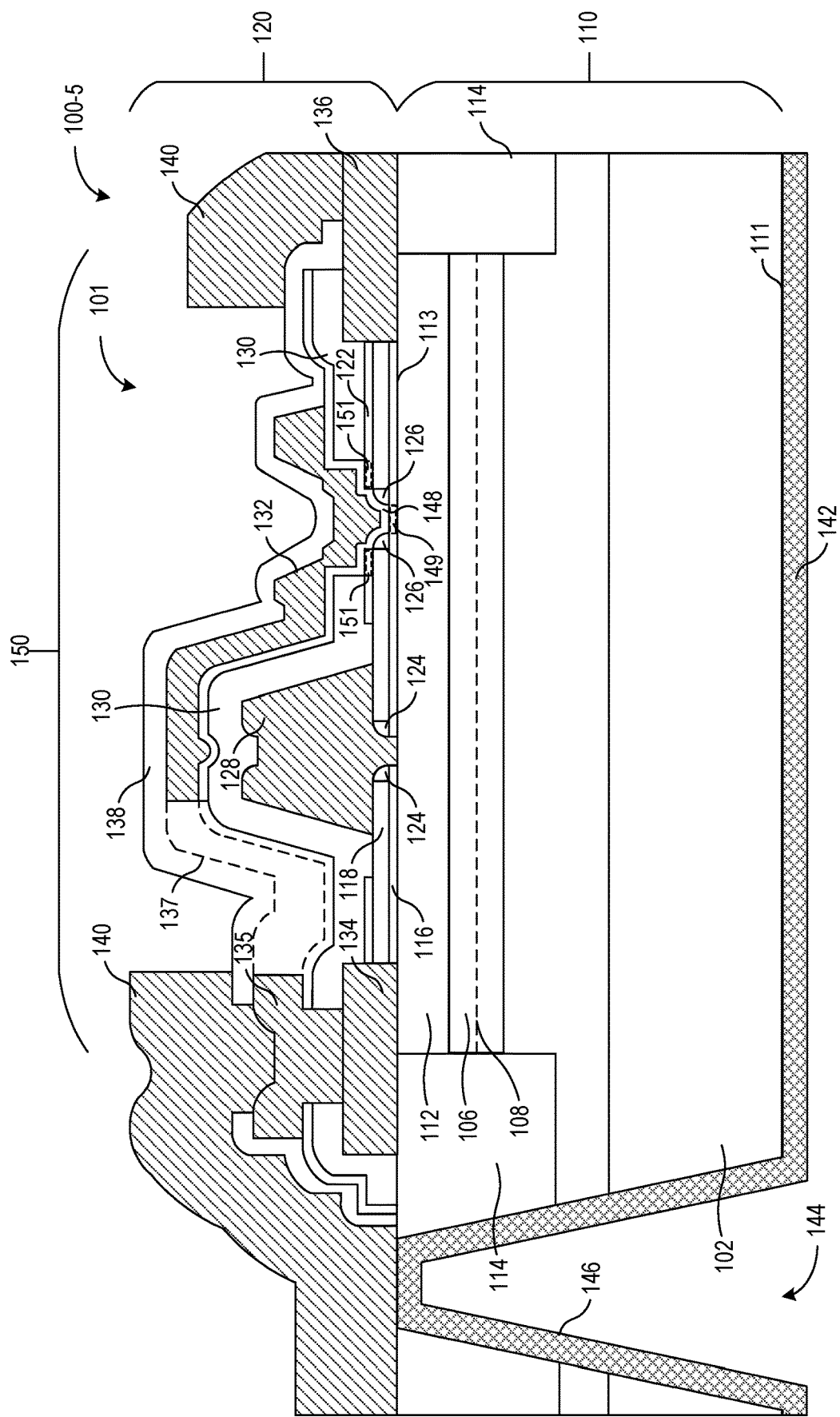

In the examples of FIGS. 1A and 1E, the field plate 132 of the transistor devices 100-1, 100-5 may extend through openings in the second dielectric layer 118 and the third dielectric layer 122, which are sometimes referred to as the "field plate channel opening" herein. The field plate 132 also may extend through an opening in the ILD layer 130. In some embodiments, dielectric spacers 126 may be disposed in the field plate channel opening into which the field plate 132 may extend. For example, the second dielectric spacers 126 may be disposed over the first dielectric layer 116 and adjacent to and in contact with portions of the second dielectric layer 118 (corresponding to sidewalls of the field plate channel opening, for example). As will be described, the second dielectric spacers 126 may reduce the size of the field plate 132 (e.g., to a gate length that is smaller than that achievable by conventional photolithographic equipment and techniques). In one or more other embodiments, the second dielectric spacers 126 may be omitted, resulting in a comparatively larger field plate 132. The desired size of the field plate 132 may vary depending on the application of the transistor devices 100-1, 100-5.

In the example of FIG. 1E, a field plate dielectric layer 148 is formed over the substrate 110 and at least partially in the field plate channel opening. In some embodiments, the field plate dielectric layer 148 layer may be formed over the first dielectric layer 116 in a region 149, over the second dielectric spacers 126 (if present), and the third dielectric layer 122. In such embodiments, portions of the field plate dielectric layer 148 may directly contact one or more of the first dielectric layer 116, the second dielectric spacers 126 (if present), and the third dielectric layer 122.

In other embodiments, portions of the first dielectric layer 116 in the region 149 and/or portions of the third dielectric layer 122 in regions 151 may be removed (etched away), and a portion of the field plate dielectric layer 148 may be disposed in the region 149 in contact with the upper surface 113 of the substrate 110 and/or in the regions 151 in contact with the upper surface of the second dielectric layer 118. In such embodiments, portions of the field plate dielectric layer may directly contact one or more of the second dielectric spacers 126 (if present), the second dielectric layer 118, and the upper surface 113 of the substrate 110.

The field plate dielectric layer 148 may be formed in a separate processing step from the steps in which other dielectric layers of the transistor device 100-5 are formed, such that the thickness of the field plate dielectric layer 148 may be more precisely controlled, thereby providing better control over the thickness of dielectric material between the field plate 132 and the upper surface 113 of the substrate 110 when fabricating the transistor device 100-5. In this way, design flexibility of the transistor device 100-5 may be desirably improved.

In the example of FIG. 1B, the field plate 132 extends through openings in the ILD layer 130 and the third dielectric layer 122 and does not extend completely through the second dielectric layer 118. In some embodiments, the field plate channel opening (and the portion of the field plate formed therein) does not extend into the second dielectric layer 118. In some embodiments, the field plate channel opening may extend partially through the third dielectric layer 122 (e.g., due to over-etching). The portion of the field plate 132 that extends through the openings in the ILD layer 130 and the third dielectric layer 122 may be in direct contact with an upper surface of the second dielectric layer 118.

In the example of FIG. 1C, the field plate 132 extends through an opening in the ILD layer 130 and does not extend through the third dielectric layer 122 or the second dielectric layer 118. The portion of the field plate 132 that extends through the opening in the ILD layer 130 may be in direct contact with an upper surface of the third dielectric layer 122.

In the example of FIG. 1D, the field plate 132 is disposed directly on the ILD layer 130 and does not extend through any of the ILD layer 130, the third dielectric layer 122, or the second dielectric layer 118.

As shown, the transistor devices 100-1, 100-2, 100-3, 100-4, 100-5 in FIGS. 1A-1E each have a respectively different thickness of dielectric material between the field plate 132 and the upper surface 113 of the substrate 110. The thickness of the dielectric material between the field plate 132 and the upper surface 113 of the substrate 110 determines the magnitude of the threshold voltage (sometimes referred to herein as the "pinch-off voltage") that, when applied to the field plate, depletes charge carriers in the channel 108 thereby substantially reducing or interrupting current flow through the transistor 101 and putting the transistor 101 into an "off" state (e.g., for embodiments in which the transistor 101 is a "normally-on" depletion-mode transistor). This field plate pinch-off voltage impacts the high-voltage characteristics of the transistor 101 and gives an extra degree of freedom for tailoring the high voltage characteristics of the transistor 101, independent of the low-voltage characteristics controlled by the gate-to-source voltage. Thus, various thicknesses of the dielectric material between the field plate 132 and the upper surface 113 of the substrate 110 may be desirable, depending on the desired high-voltage characteristics for the transistor 101.

Figure 2:
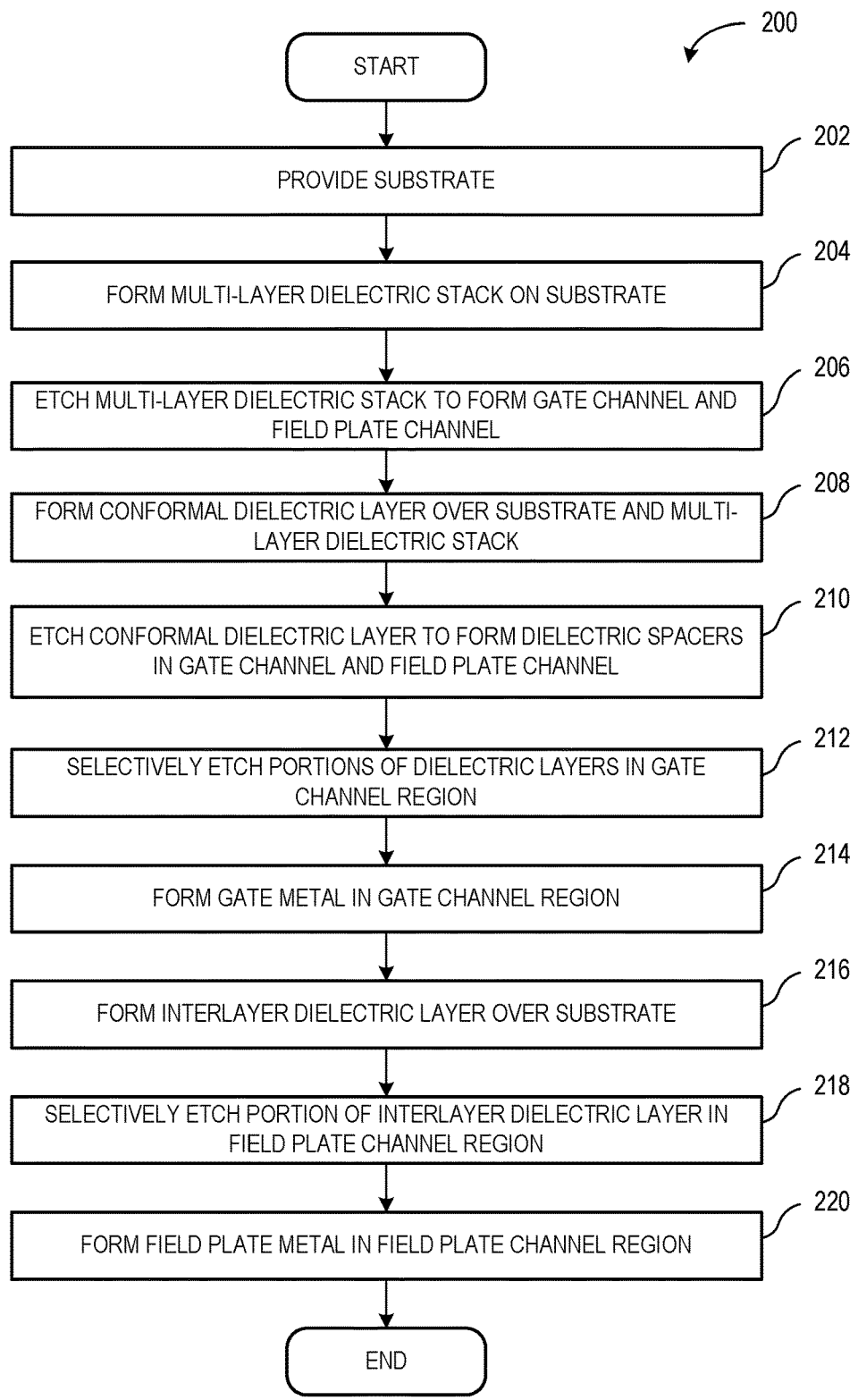
FIGS. 2, 3, 4, 5, and 6 are a process flow diagrams describing methods for fabricating the respective transistor devices of FIGS. 1A, 1B, 1C, 1D, and 1E, in accordance with various embodiments.

FIG. 2 is a process flow diagram depicting a method for fabricating at least a portion of a transistor device, such as the transistor device 100-1 of FIG. 1A, in accordance with various embodiments. For enhanced understanding, FIG. 2 may be viewed simultaneously with FIGS. 7, 8, 9A, 10A, 11A, 12A, 13A, 14A, 15A, and 17A, which are cross sectional views depicting the transistor device 100-1 of FIG. 1A at various stages of fabrication in accordance with various embodiments.

Figure 3:
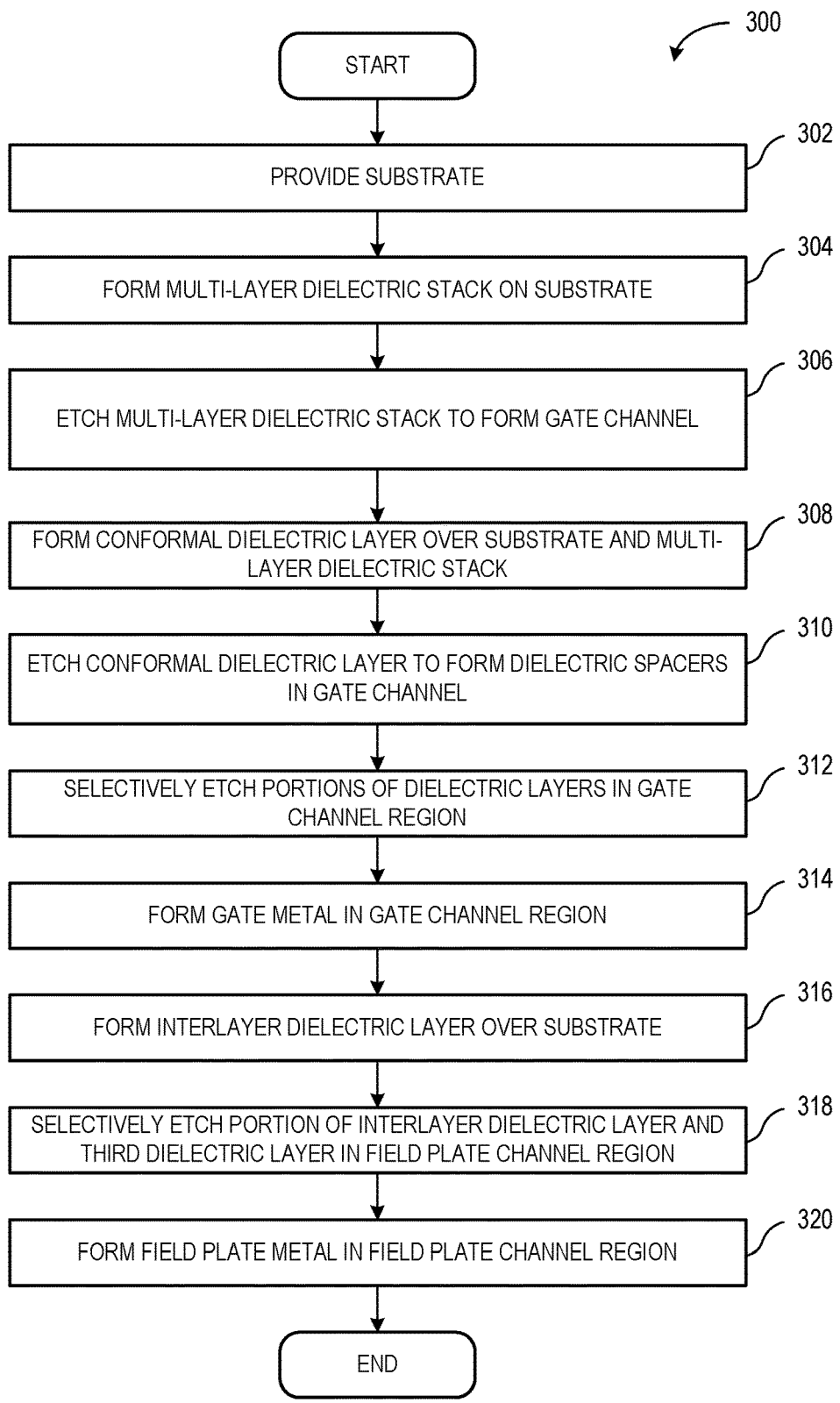

FIG. 3 is a process flow diagram depicting a method for fabricating at least a portion of a transistor device, such as the transistor device 100-2 of FIG. 1B, in accordance with various embodiments. For enhanced understanding, FIG. 3 may be viewed simultaneously with FIGS. 7, 8, 9B, 10B, 11B, 12B, 13B, 14B, 15B, and 17B, which are cross sectional views depicting the transistor device 100-2 of FIG. 1B at various stages of fabrication in accordance with various embodiments.

Figure 4:
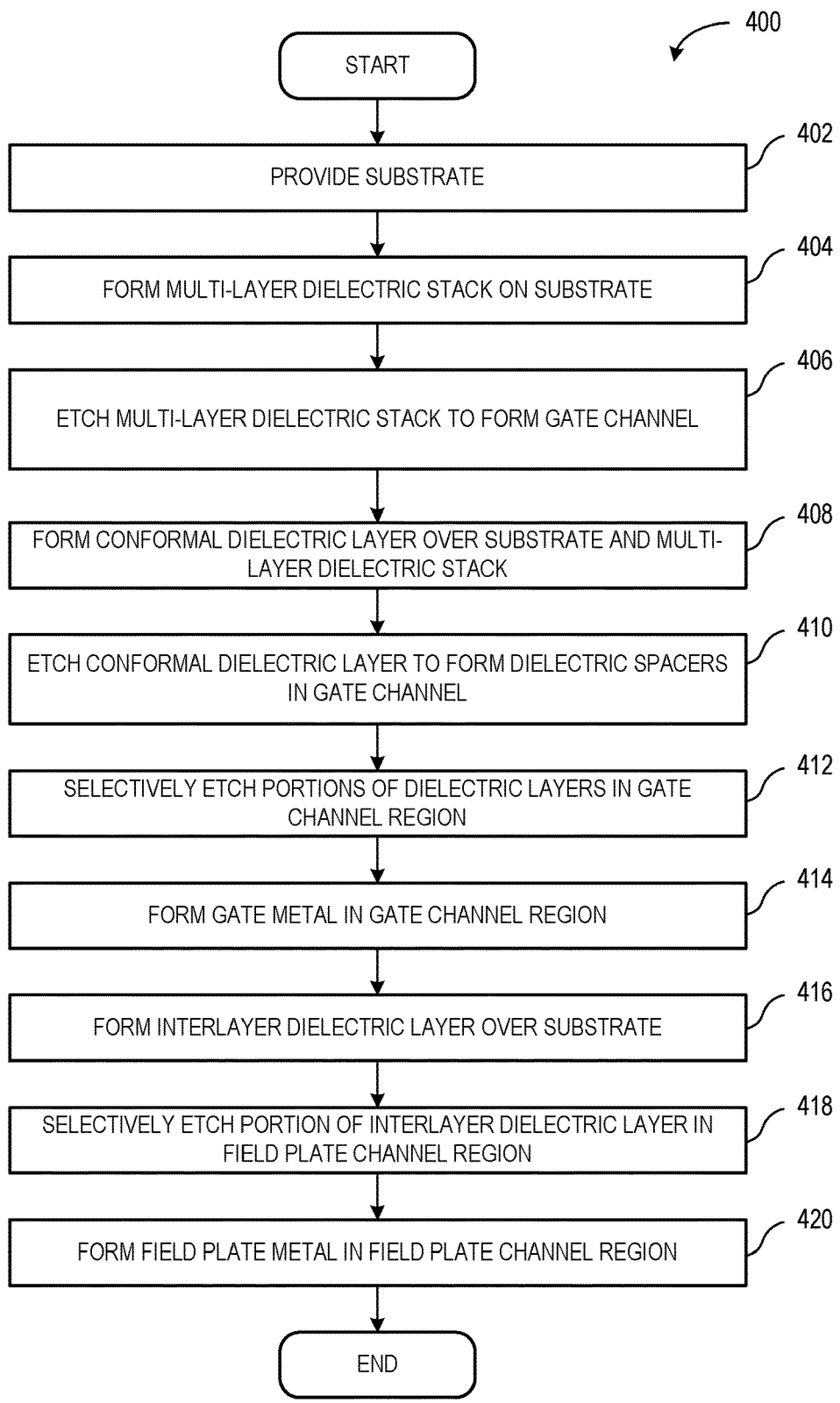

FIG. 4 is a process flow diagram depicting a method for fabricating at least a portion of a transistor device, such as the transistor device 100-3 of FIG. 1C, in accordance with various embodiments. For enhanced understanding, FIG. 4 may be viewed simultaneously with FIGS. 7, 8, 9B, 10B, 11B, 12C, 13C, 14C, 15C, and 17C, which are cross sectional views depicting the transistor device 100-3 of FIG. 1C at various stages of fabrication in accordance with various embodiments.

Figure 5:
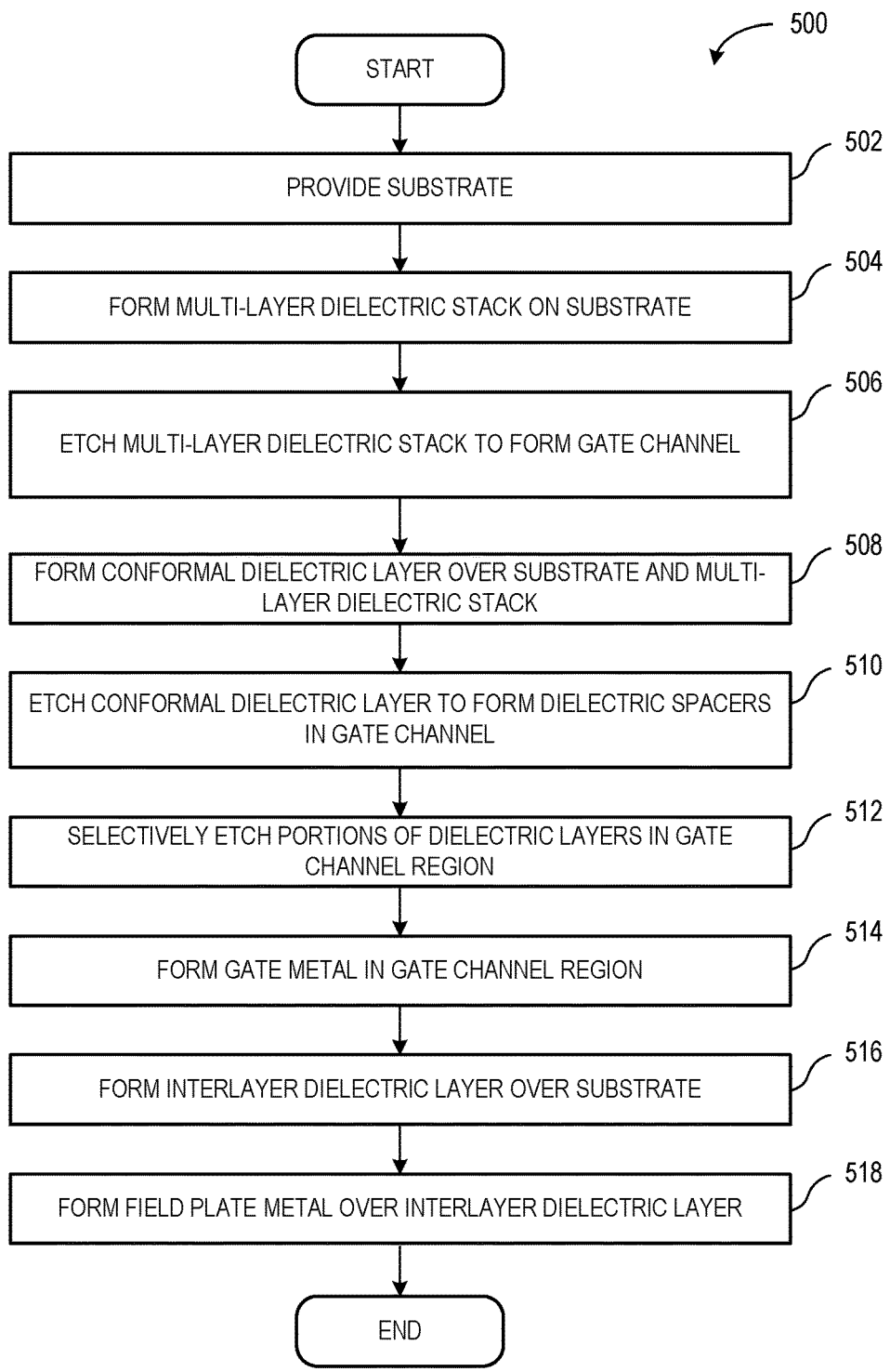

FIG. 5 is a process flow diagram depicting a method for fabricating at least a portion of a transistor device, such as the transistor device 100-4 of FIG. 1D, in accordance with various embodiments. For enhanced understanding, FIG. 5 may be viewed simultaneously with FIGS. 7, 8, 9B, 10B, 11B, 12C, 13C, 14C, and 17D, which are cross sectional views depicting the transistor device 100-4 of FIG. 1D at various stages of fabrication in accordance with various embodiments.

Figure 6:
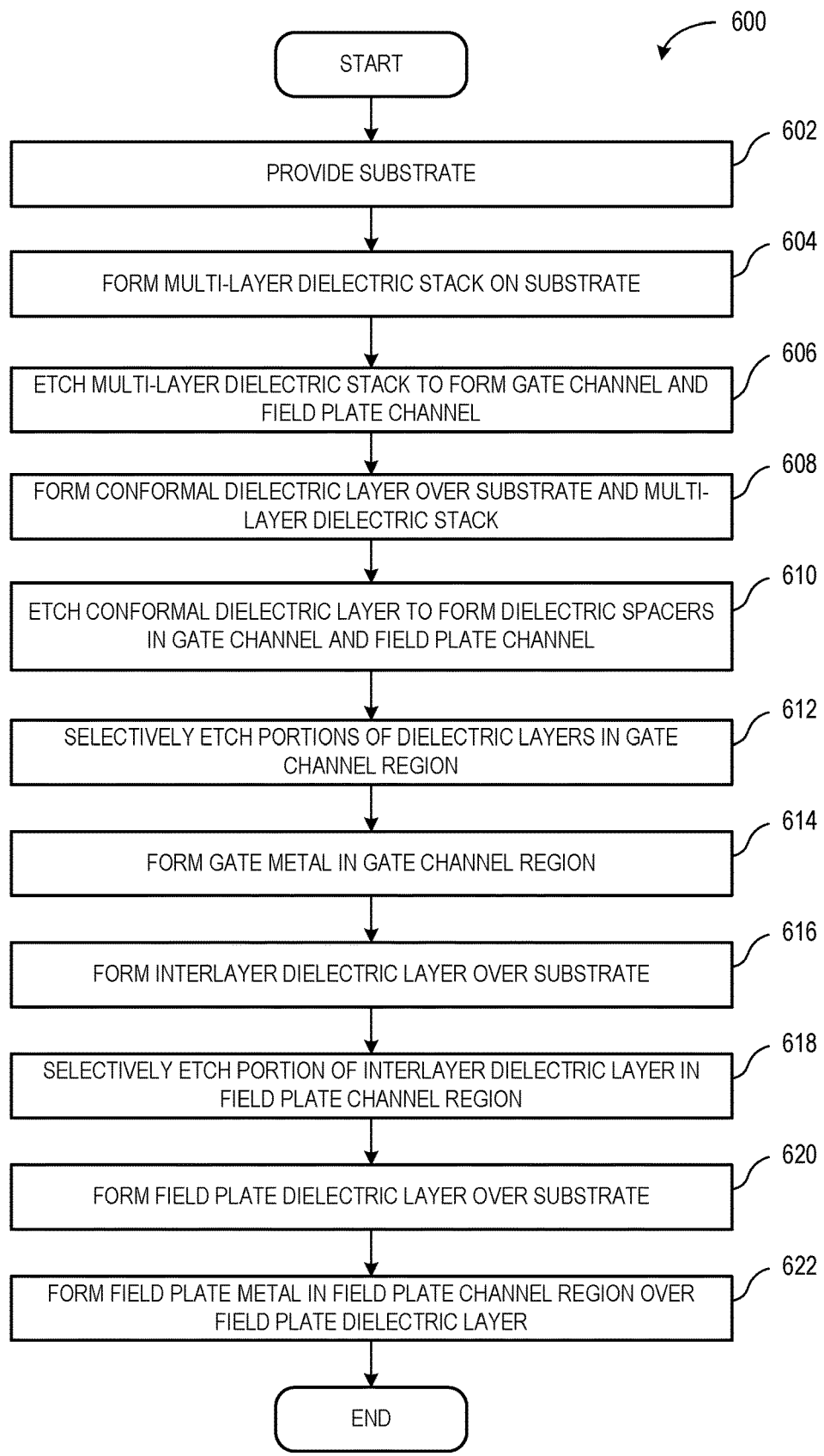

FIG. 6 is a process flow diagram depicting a method for fabricating at least a portion of a transistor device, such as the transistor device 100-5 of FIG. 1E, in accordance with various embodiments. For enhanced understanding, FIG. 6 may be viewed simultaneously with FIGS. 7, 8, 9A, 10A, 11A, 12A, 13A, 14A, 15A, 16, and 17E, which are cross sectional views depicting the transistor device 100-5 of FIG. 1E at various stages of fabrication in accordance with various embodiments.

Figure 7:
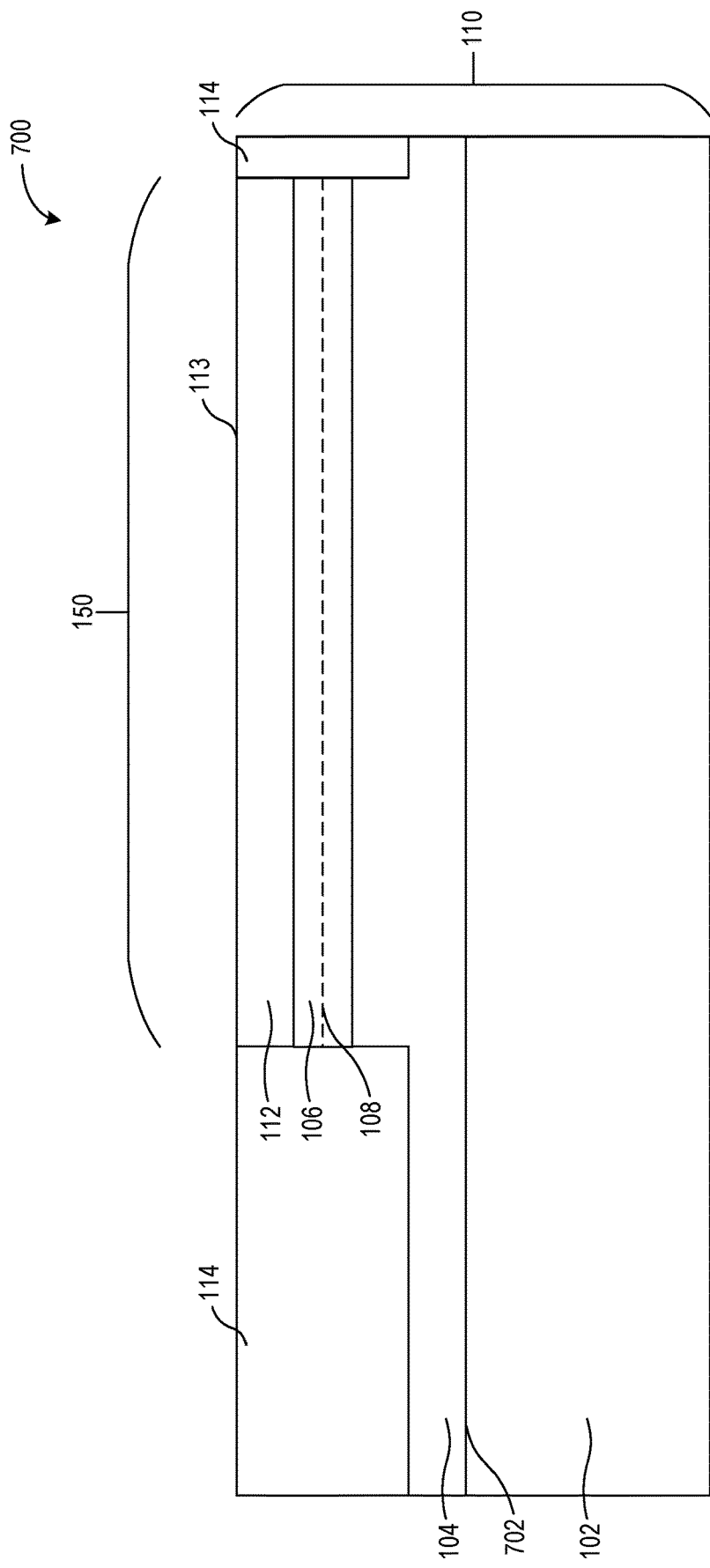
FIGS. 7, 8, 9A, 9B, 10A, 10B, 11A, 11B, 12A, 12B, 13A, 13B, 14A, 14B, 15A, 15B, 15C, 16, 17A, 17B, 17C, 17D, and 17E are cross sectional views depicting the transistor devices of FIGS. 1A, 1B, 1C, 1D, and 1E at various stages of fabrication, in accordance with various embodiments.
Figure 8:
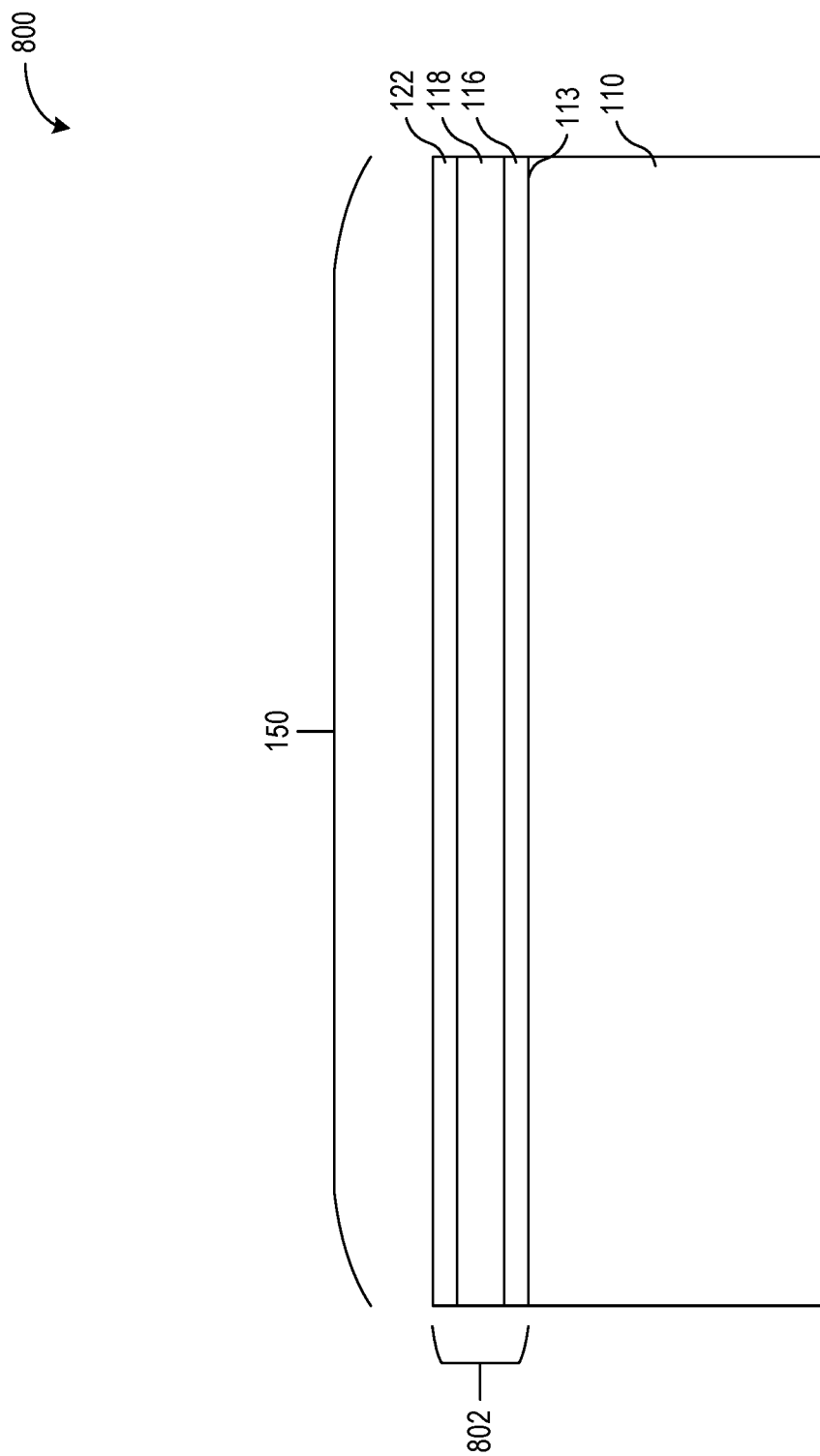

Referring first to steps 202, 302, 402, 502, and 602 of FIGS. 2-6 and to FIG. 7, at a first stage of fabrication 700, a semiconductor substrate 110 is provided, and an active region 150 is defined in the semiconductor substrate 110. As mentioned previously, the semiconductor substrate 110 may include a host semiconductor substrate 102 ("host substrate") and multiple layers overlying the host substrate 102. According to an embodiment, the layers overlying the host substrate 102 includes a buffer layer 104, a channel layer 106, and a barrier layer 112.

In an embodiment, the host substrate 102 includes an upper surface 702 and may be formed from silicon carbide (SiC). In other embodiments, the host substrate 102 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The buffer layer 104 may be formed on the upper surface 702 of host substrate 102. The buffer layer 104 may include one or more group III-nitride semiconductor layers. In some embodiments, the buffer layer 104 includes multiple layers of semiconductor material, where each of the layers of buffer layer 104 may include an epitaxially grown group-III nitride layer, for example. In such embodiments, the epitaxially grown group-III nitride layers of the buffer layer 104 may include nitrogen (N)-polar (i.e., N-face) or gallium (Ga)-polar (i.e., Ga-face) material, for example. In one or more other embodiments, the semiconductor layer(s) of the buffer layer 104 may not be epitaxially grown. In still other embodiments, the semiconductor layer(s) of the buffer layer 104 may include Si, GaAs, InP, or other suitable materials.

In some embodiments, the buffer layer 104 may include at least one AlGaN mixed crystal layer having a composition denoted by $Al_XGa_{1-X}N$ with an aluminum mole fraction, X, that can take on values between 0 and 1. The total thickness of buffer layer 104, including all of its constituent layers, may be between about 100 angstroms and about 100,000 angstroms although other thicknesses may be used. A limiting X value of 0 yields pure GaN while a value of 1 yields pure aluminum nitride (AlN). In an embodiment, the buffer layer 104 may include a nucleation region comprised of AlN. The nucleation region starts at the interface between the host substrate 102 and buffer layer 104 and may extend about 100 angstroms to about 1000 angstroms into buffer layer 104. The buffer layer 104 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layer(s) may be configured as GaN layer(s) (X=0) where the $Al_XGa_{1-X}N$ layer(s) are not intentionally doped (NID). Alternatively, the additional $Al_XGa_{1-X}N$ layer(s) may be configured as one or more GaN layers where the one or more GaN layers are intentionally doped with dopants that may include iron (Fe), chromium (Cr), carbon (C) or other suitable dopants that render buffer layer 104 substantially insulating or highly resistive. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, a combination of these, or other suitable dopant species. In one or more other embodiments, the additional $Al_XGa_{1-X}N$ layers may be configured as a superlattice where the additional $Al_XGa_{1-X}N$ layers include a series of alternating NID or doped $Al_XGa_{1-X}N$ layers where the value of X takes a value between 0 and 1. In still other embodiments, buffer layer 104 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 angstroms and about 1000 angstroms though other thicknesses may be used.

In an embodiment, the channel layer 106 may be formed over buffer layer 104. The channel layer 106 may include one or more group III-nitride semiconductor layers. The channel layer 106 may include an $Al_XGa_{1-X}N$ layer where X takes on values between 0 and 1. In an embodiment, the channel layer 106 is configured as GaN (X=0) although other values of X may be used. The thickness of the channel layer 106 may be between about 50 angstroms and about 10,000 angstroms, though other thicknesses may be used. The channel layer 106 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 106 may include NID or doped $In_YGa_{1-Y}N$, where Y, the indium mole fraction, may take a value between 0 and 1.

The barrier layer 112 may be formed over the channel layer 106, in accordance with an embodiment. The barrier layer 112 may include one or more group III-N semiconductor layers. The barrier layer 112 may have a larger bandgap and/or larger spontaneous polarization than the channel layer 106 and, when the barrier layer 112 is over channel layer 106, the channel 108 may be created in the form of a two-dimensional electron gas (2-DEG) within channel layer 106 adjacent the interface between the channel layer 106 and the barrier layer 112. In addition, tensile strain between the barrier layer 112 and channel layer 106 may cause additional piezoelectric charge to be introduced into the 2-DEG and the channel 108. The barrier layer 112 may include a multi-layer structure, where the first layer of the barrier layer 112 may include at least one NID $Al_XGa_{1-X}N$ layer where X takes on values between 0 and 1. In some embodiments, X may take a value of 0.1 to 0.35, although other values of X may be used. The thickness of the first layer of the barrier layer 112 may be between about 50 angstroms and about 1000 angstroms though other thicknesses may be used. The barrier layer 112 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used.

An additional AlN interbarrier layer (not shown) may be formed between the channel layer 106 and the barrier layer 112, in some embodiments. The AlN interbarrier layer may introduce additional spontaneous and piezoelectric polarization, increasing the channel charge and improving the electron confinement of the resultant 2-DEG that forms the channel 108.

In other embodiments, the barrier layer 112 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form the barrier layer 112, the thickness of the barrier layer 112 may be between about 50 angstroms and about 1000 angstroms though other thicknesses may be used. In the case of using InAlN to form the barrier layer 112, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In some embodiments, a cap layer (not shown) may be formed over the barrier layer 112. When included, the cap layer presents a stable surface for the substrate 110 and serves to protect the upper surface 113 of the substrate 110 from chemical and environmental exposure incidental to wafer processing. The cap layer may include one or more group III-N semiconductor layers and is supported by the barrier layer 112. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

The isolation regions 114 may be formed via an implantation procedure configured to damage the epitaxial and/or other semiconductor layers to create high resistivity regions of the substrate 110, rendering the substrate 110 high resistivity or semi-insulating in the high resistivity regions while leaving the crystal structure intact in the active region 150. In other embodiments (not shown), one or more of the isolation regions 114 may be formed by removing portions of one or more of the epitaxial and/or other semiconductor layers of the substrate 110 and leaving behind active region "mesas", such as the active region 150, surrounded by the isolation regions 114 (i.e., surrounded by regions of high resistivity or semi-insulating material).

The transistor structure 101 (FIGS. 1A, 1B, 1C, 1D, 1E) may then be formed within the active region 150. Referring next to steps 204, 304, 404, 504, and 604 of FIGS. 2-6 and to FIG. 8, during a stage of fabrication 800, a multi-layer dielectric stack 802 (a three-layer dielectric stack, in the present example) may be formed on the upper surface 113 of the semiconductor substrate 110. The multi-layer dielectric stack may include a first dielectric layer 116 formed over (e.g., on) the upper surface 113 of the semiconductor substrate 110, a second dielectric layer 118 formed on the first dielectric layer 116, and a third dielectric layer 122 formed on the second dielectric layer 118. As mentioned above, in some embodiments, the first dielectric layer 116 may have a thickness in a range of about 10 angstroms to about 500 angstroms, the second dielectric layer 118 may have a thickness in a range of about 100 angstroms to about 1500 angstroms, and the third dielectric layer 122 may have a thickness in a range of about 10 angstroms to about 500 angstroms, although other thickness values may be used. Further, according to an embodiment, each of the dielectric layers 116, 118, 122 are formed from respective dielectric materials, such as $Al_2O_3$, SiN, $Si_3N_4$, $SiO_2$, SiON, AlN, SiAlN, $HfO_2$, $ZrO_2$, $TiO_2$, or other suitable materials. In some embodiments, the first dielectric layer 116 and the third dielectric layer 122 may each include a first dielectric material and the second dielectric layer 118 may include a second dielectric material that is different from the first dielectric material. For example, the first dielectric material may have a different etch rate than the second dielectric material (e.g., with respect to one or more wet etch and/or anisotropic dry etch processes). For example, the first dielectric material may be AN, and the second dielectric material may be SiN. In some embodiments, the dielectric layers 116, 118, 122 are deposited on the substrate 110 using respective chemical vapor deposition processes, such as LPCVD.

Figure 9A:
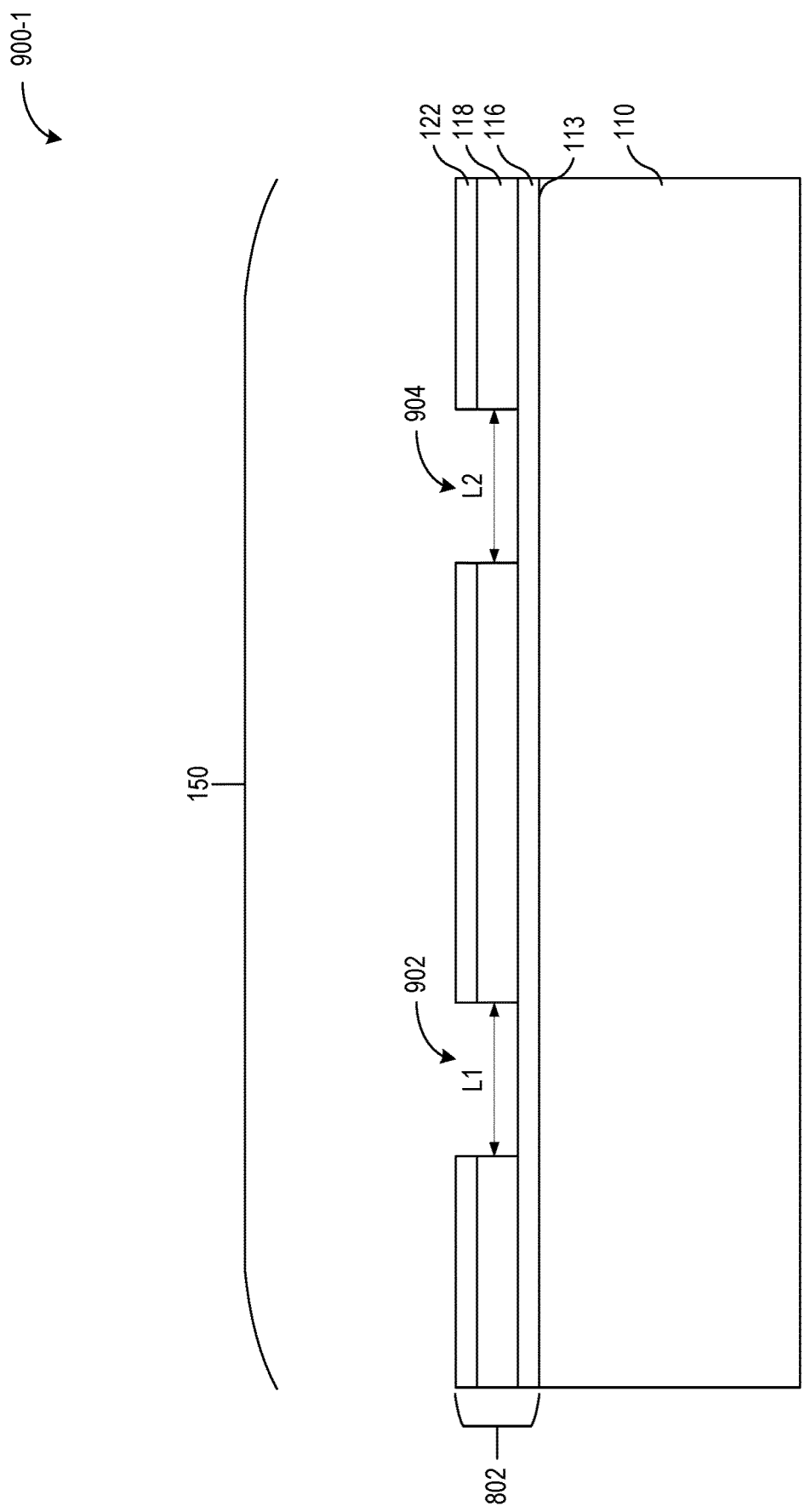
Figure 9B:
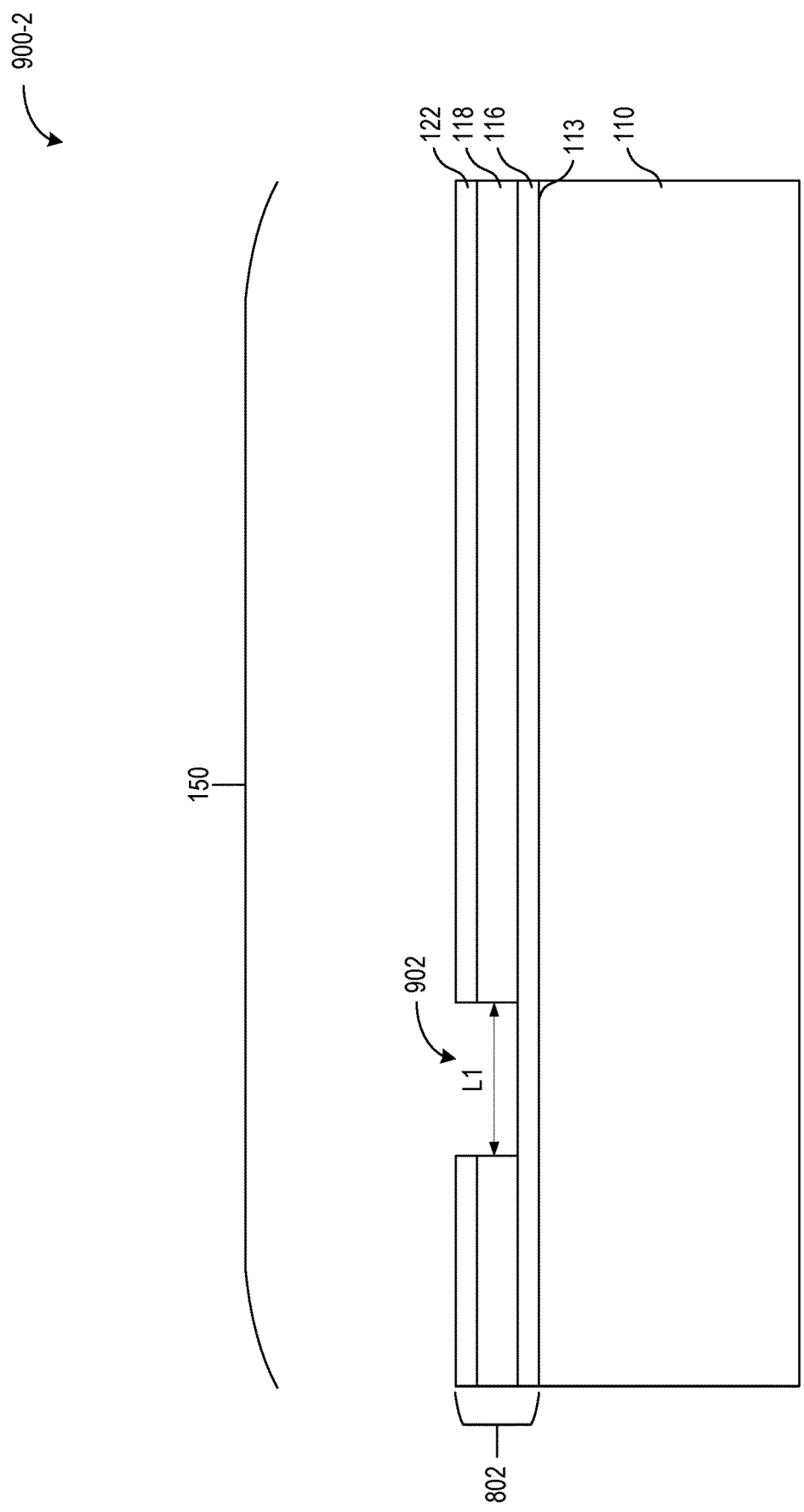

FIGS. 9A and 9B show respective stages of fabrication 900-1, 900-2 corresponding to the formation one or more channel openings in the multi-layer dielectric stack 802. The stage of fabrication 900-1 of FIG. 9A may correspond to a stage of fabrication of either of the transistor device 100-1 of FIG. 1A and the transistor device 100-5 of FIG. 1E. The stage of fabrication 900-2 of FIG. 9B may correspond to a stage of fabrication of any of the transistor device 100-2 of FIG. 1B, the transistor device 100-3 of FIG. 1C, and the transistor device 100-4 of FIG. 1D.

Figure 15A:
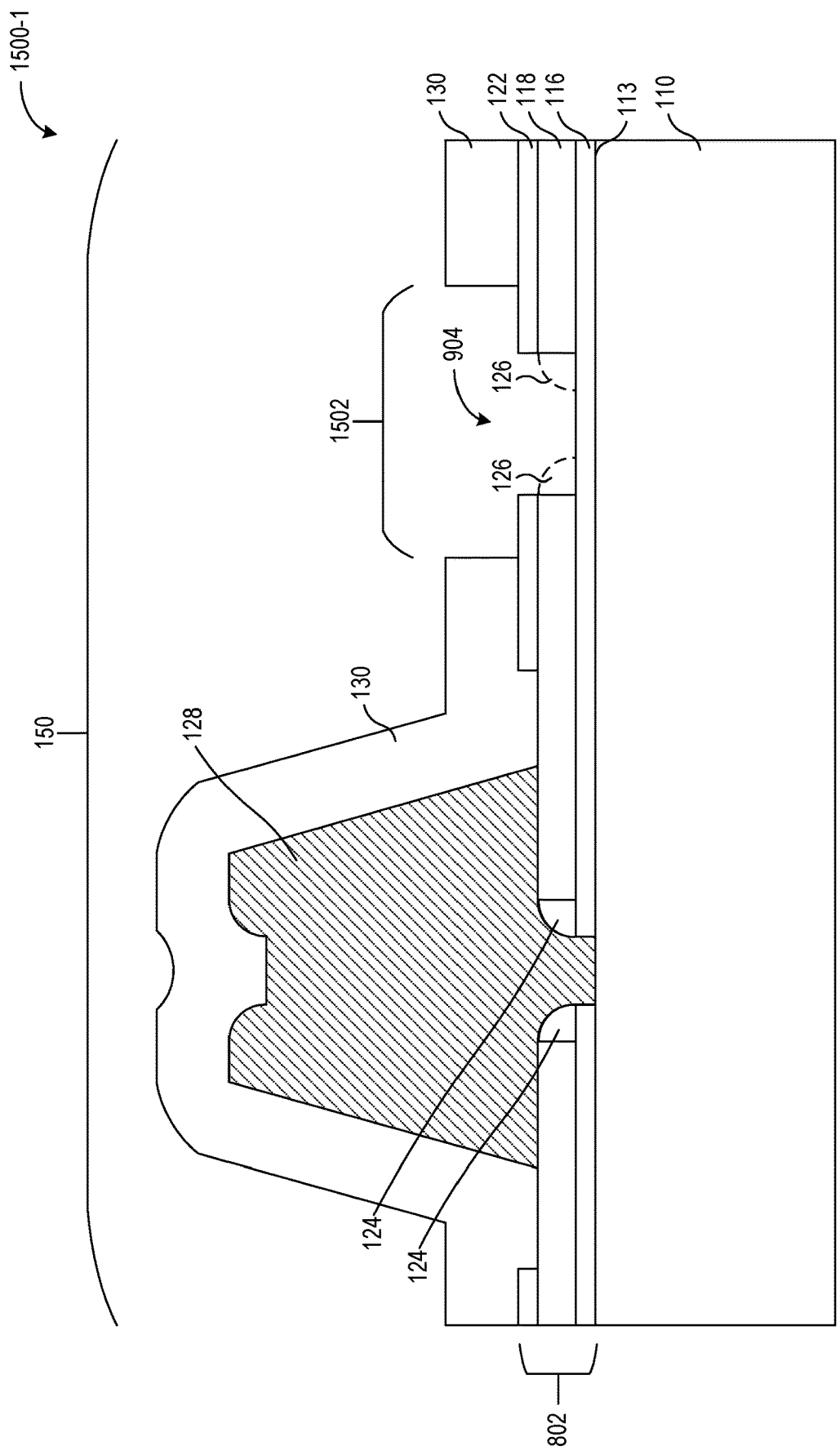
Figure 15B:
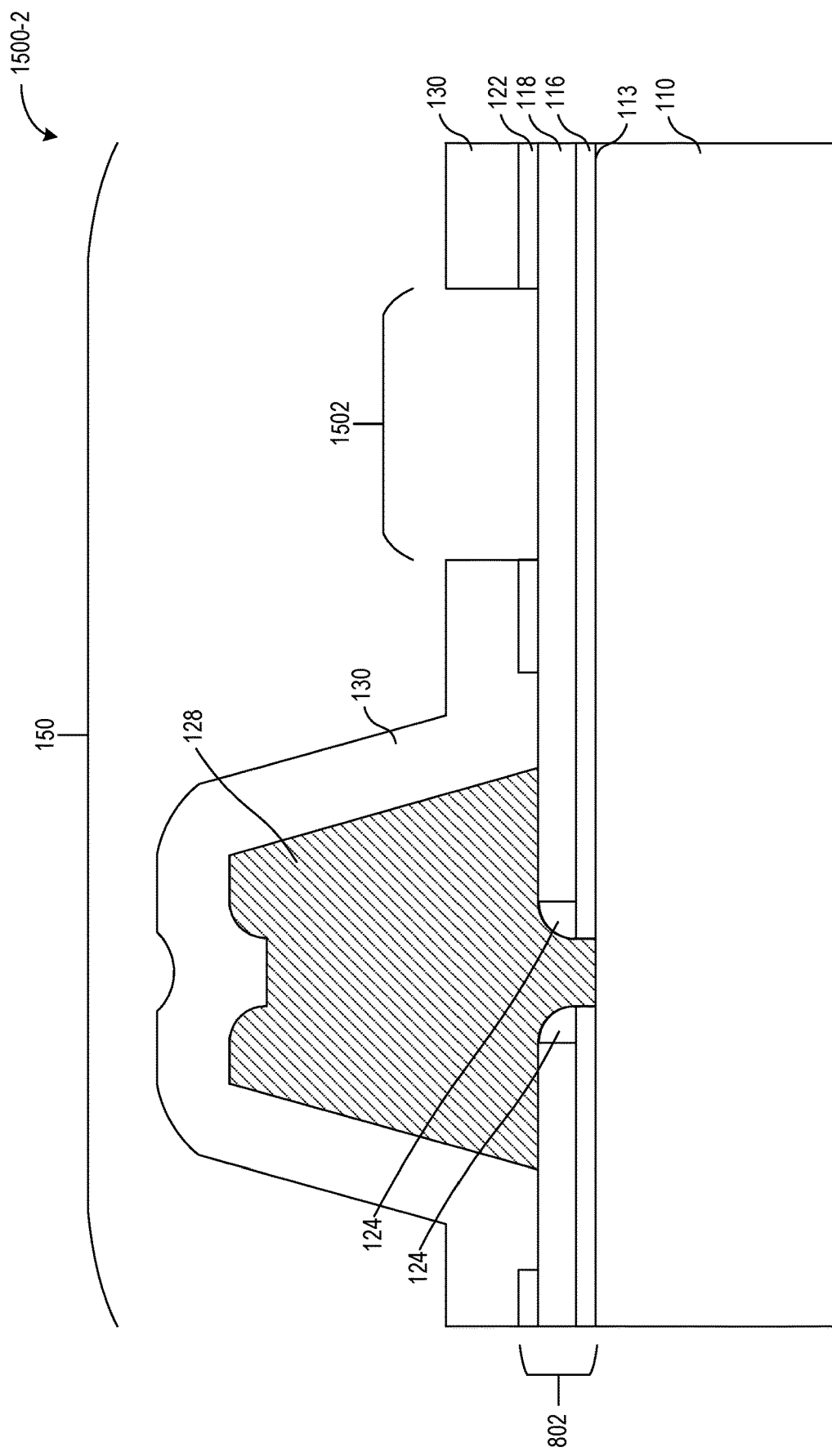
Figure 15C:
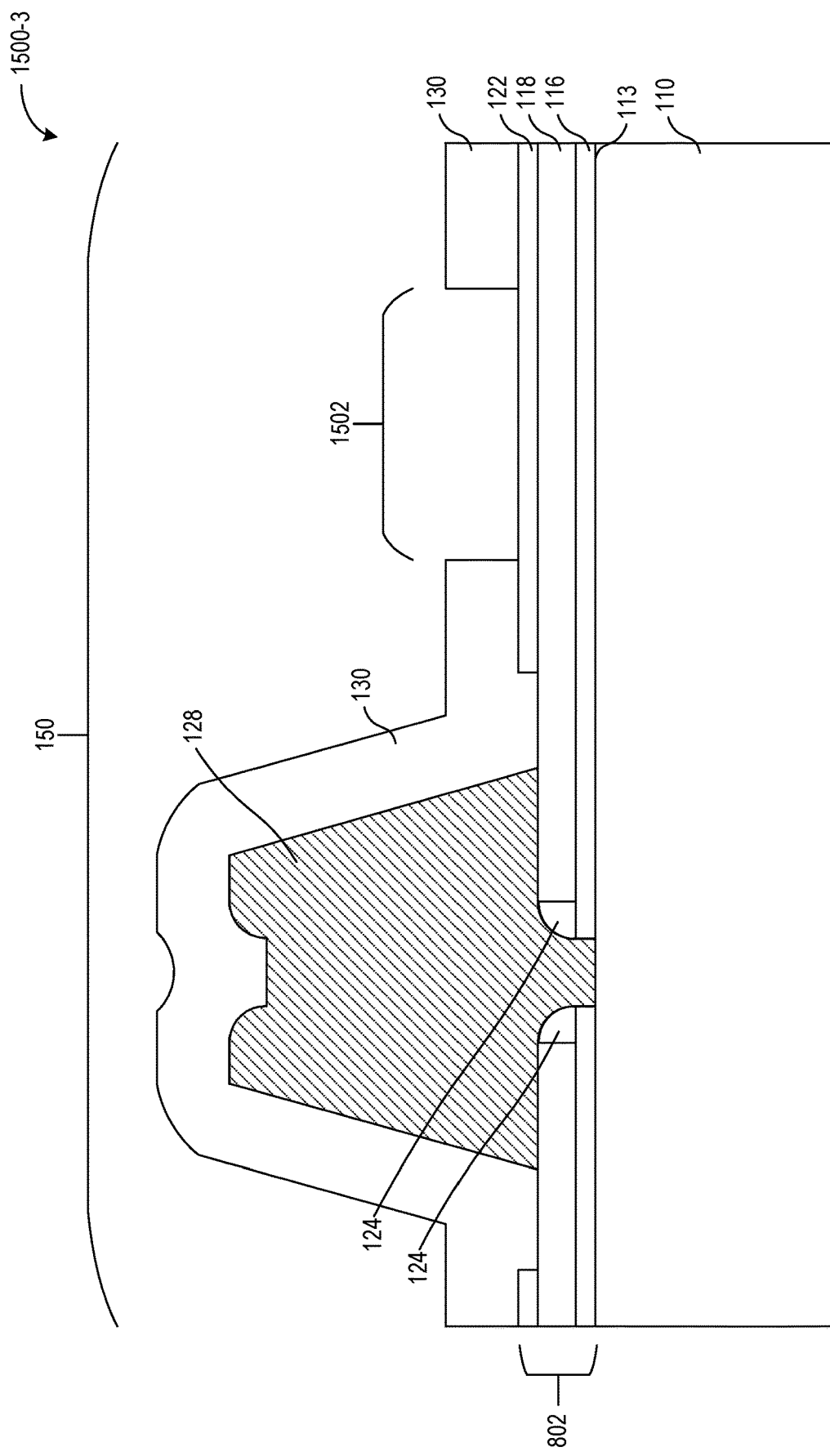

Referring to steps 206 and 606 of FIGS. 2 and 6 and to FIG. 9A, during a stage of fabrication 900-1, a gate channel opening 902 (e.g., sometimes referred to herein as the "gate channel region" or the "control electrode channel opening") and a field plate channel opening 904 (e.g., located within a field plate region, such as the field plate region 1502 of FIGS. 15A-C) are formed in the multi-layer dielectric stack 902. For example, the gate channel opening 902 and the field plate channel opening 904 may be formed using an anisotropic dry etch process, which may be a reactive-ion etching (RIE) process. In some embodiments, the gate channel opening 902 and the field plate channel opening 904 are respectively formed using two sequential selective anisotropic dry etch steps. While wet etch techniques typically form openings in a substrate having sidewalls that are substantially non-vertical (i.e., not perpendicular to the upper surface 113 of the substrate 110), anisotropic dry etch processes are capable of forming openings in substrates having high aspect ratios and vertical or nearly vertical sidewalls (i.e., sidewalls that are aligned perpendicularly or substantially perpendicularly with respect to the upper surface 113 of the substrate 110). Thus, sidewalls of the gate channel opening 902 and sidewalls of the field plate channel opening 904 may be substantially vertical (perpendicular to the upper surface 113). In the present example, the distance between sidewalls of the gate channel opening 902 may be characterized by a first length L1 and the distance between sidewalls of the field plate channel opening 904 may be characterized by a second length L2. In some embodiments, the length L1 may be equal to or substantially equal to the length L2, while in other embodiments these lengths may be different.

As shown, each of the gate channel opening 902 and the field plate channel opening 904 may extend through the second dielectric layer 118 and the third dielectric layer 122 of the multi-layer dielectric stack 802, without extending through the first dielectric layer 116. As shown, the gate channel opening 902 and the field plate channel opening 904 do not extend through the first dielectric layer 116. The first dielectric layer 116 may protect the surface 113 of the semiconductor substrate 110, effectively acting as an etch-stop layer during the anisotropic dry etch process that forms the gate channel opening 902 and the field plate channel opening 904. For example, anisotropic dry etch recipes impart significant energy to the ions used for etching, which can cause damage to sensitive surfaces, such as the surface 113 of the semiconductor substrate 110 (e.g., a surface of the barrier layer 112, shown in FIGS. 1A-1E, 7). If such damage is allowed to occur in the active region 150 in which the transistor structure 101 is to be formed, issues such as excessive gate leakage or undesirable trapping effects may undesirably result. Thus, by forming the gate channel opening 902 and the field plate channel opening 904 through the second dielectric layer 118 and the third dielectric layer 122 without extending completely through the first dielectric layer 116, damage to the surface 113 of the semiconductor substrate 110 from the anisotropic etch process may be mitigated.

In some embodiments, ohmic contact metals, such as those of the source and drain electrodes 134, 136, are not deposited until after formation of the gate channel opening 902. Formation of such ohmic contact metals typically reduces the flatness of the wafer on which a device (e.g., the transistor device 100) is formed. Device yield and gate length reproducibility are affected by the flatness of the wafer surface, with better wafer flatness typically resulting in higher device yield and better gate length reproducibility for devices across the wafer. Thus, by waiting to form ohmic contact metals until after formation of the gate channel opening 902, device yield and gate length reproducibility for the wafer on which the transistor device 100 is fabricated may be improved.

In some embodiments in which the ohmic contact metals are formed after forming the gate channel opening 902, openings (not illustrated) in the second dielectric layer 118 and the third dielectric layer 122 may be formed concurrently with the gate channel opening 902 and the field plate channel opening 904, with the ohmic contact metals for the source and drain electrodes 134, 136 being deposited in these openings in a subsequent processing step. This may advantageously reduce the total number of processing steps used to fabricate the transistor 101 of the transistor device 100.

Referring next to steps 306, 406, 506, of FIGS. 3-5 and to FIG. 9B, during a stage of fabrication 900-2, the gate channel opening 902 is formed in the multi-layer dielectric stack 802. Some aspects of forming the gate channel opening 902 having a length L1 through the third dielectric layer 122 and the second dielectric layer 118 (e.g., via an anisotropic dry etch process) at the stage of fabrication 900-2 may be similar to those described above in connection with the stage of fabrication 900-1 of FIG. 9A, and corresponding details are not repeated here for sake of brevity. However, it should be noted that the field plate channel opening 904 is not formed in the multi-layer dielectric stack 802 during the stage of fabrication 900-2. For example, the region over the substrate 110 in which the field plate channel opening 904 is formed during the stage of fabrication 900-1 is instead protected (e.g., via a patterned photoresist layer) when etching the gate channel opening 902 in the stage of fabrication 900-2.

Figure 10A:
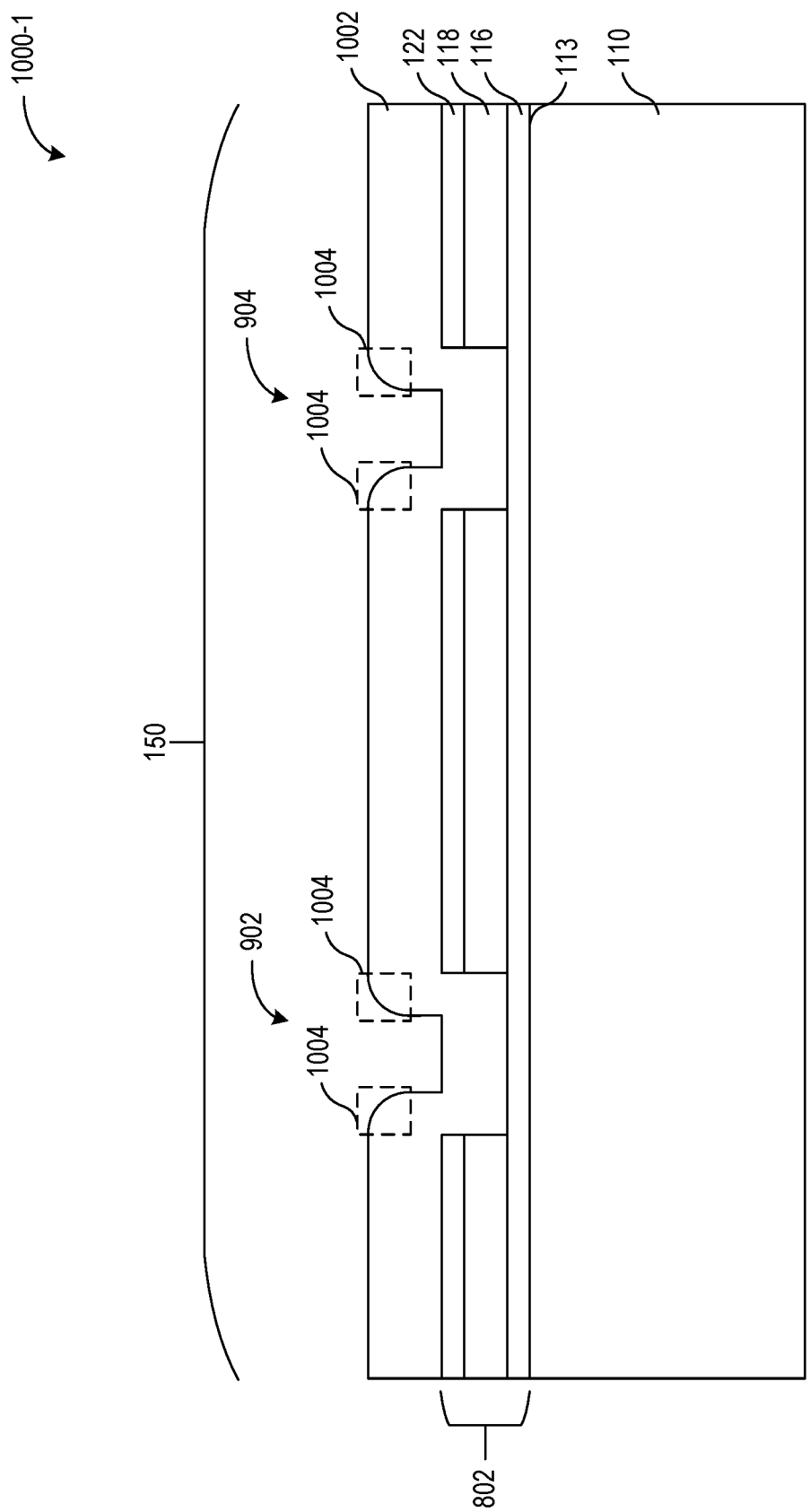
Figure 10B:
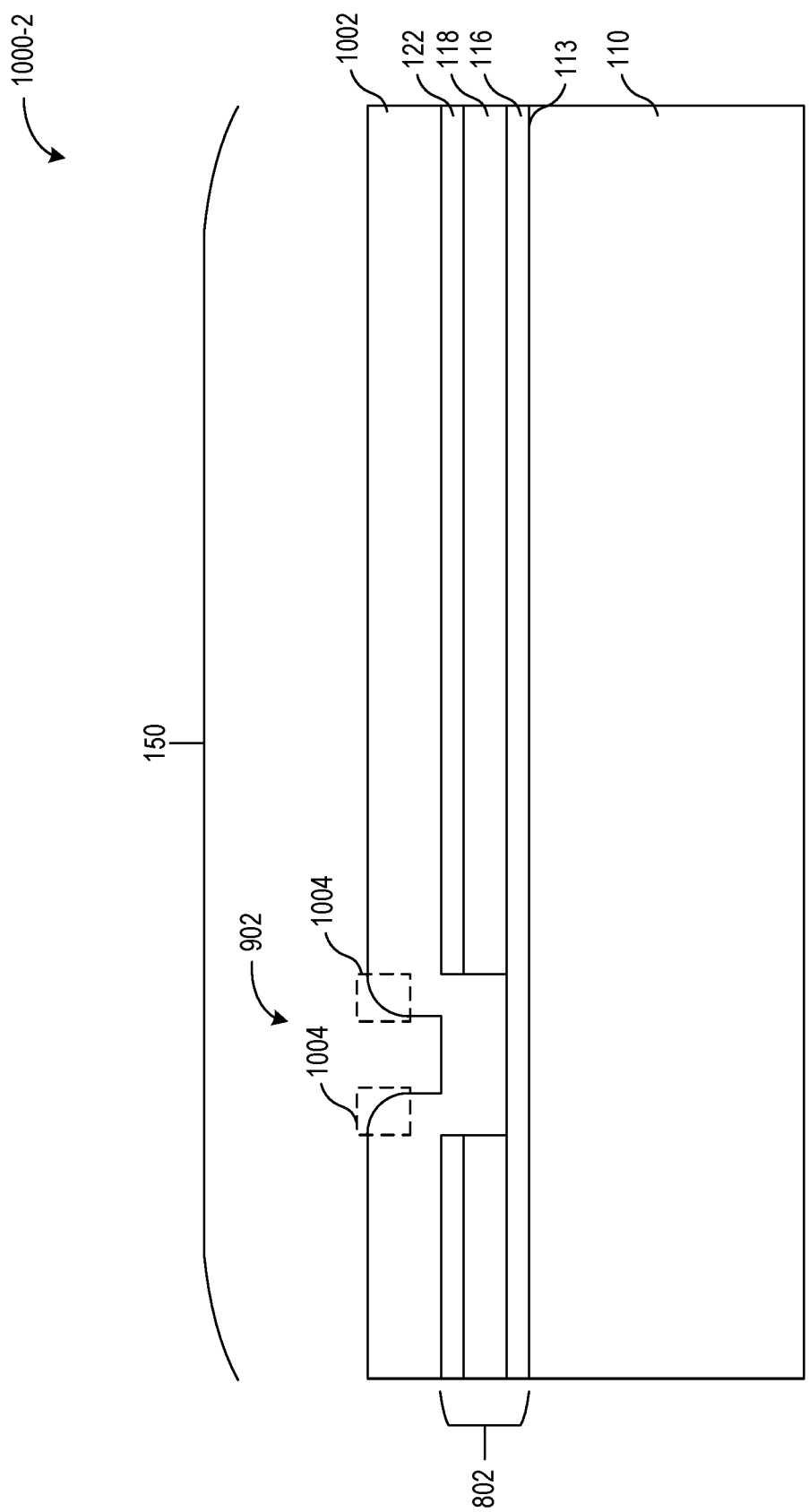

FIGS. 10A and 10B show respective stages of fabrication 1000-1, 1000-2 corresponding to the formation of a conformal dielectric layer 1002 over the multi-layer dielectric stack 802. The stage of fabrication 1000-1 of FIG. 10A may correspond to a stage of fabrication of either of the transistor device 100-1 of FIG. 1A and the transistor device 100-5 of FIG. 1E. The stage of fabrication 1000-2 of FIG. 10B may correspond to a stage of fabrication of any of the transistor device 100-2 of FIG. 1B, the transistor device 100-3 of FIG. 1C, and the transistor device 100-4 of FIG. 1D.

Referring to steps 208 and 608 of FIGS. 2 and 6 and to FIG. 10A, during a stage of fabrication 1000-1, a conformal dielectric layer 1002 may be formed over the semiconductor substrate 110 and the multi-layer dielectric stack 802. The conformal dielectric layer 1002 may be formed (e.g., deposited) over the entire upper surface of the wafer that includes the semiconductor substrate 110. According to various embodiments, the conformal dielectric layer 1002 may have a thickness in a range of about 500 angstroms to about 5000 angstroms.

In some embodiments, the conformal dielectric layer 1002 may include the same dielectric material as that of the second dielectric layer 118 (e.g., SiN) or another dielectric material having a similar etch rate (i.e., low etch selectivity) with respect to that of the dielectric material of the second dielectric layer 118. In some embodiments, the conformal dielectric layer 1002 includes dielectric material having a different etch rate (i.e., high etch selectivity) with respect to that of the dielectric material of the first and third dielectric layers 116, 122. It should be noted that regions of the conformal dielectric layer 1002 are non-planar, with depressions in the conformal dielectric layer 1002 overlapping the gate channel opening 902 and the field plate channel opening 904, for example. Excess dielectric material 1004 of the conformal dielectric layer 1002 builds up at sidewalls of these depressions during formation (e.g., deposition) of the conformal dielectric layer 1002. The buildup of the excess dielectric material 1004 results in the conformal dielectric layer 1002 having a greater thickness in regions that include the excess dielectric material 1004. In the present example, the excess dielectric material 1004 is formed over portions of the gate channel opening 902 and the field plate channel opening 904, such that the conformal dielectric layer 1002 is thicker near sidewalls of the gate channel opening 902 and the field plate channel opening 904.

Referring next to steps 308, 408, 508, of FIGS. 3-5 and to FIG. 10B, during a stage of fabrication 1000-2, the conformal dielectric layer 1002 is formed over the semiconductor substrate 110 and the multi-layer dielectric stack 802. Some aspects of forming the conformal dielectric layer 1002 at the stage of fabrication 1000-2 (and, in some embodiments, aspects of the conformal dielectric layer 1002 itself) may be similar to those described above in connection with the stage of fabrication 1000-1 of FIG. 10A, and corresponding details are not repeated here for sake of brevity. However, it should be noted that the field plate channel opening 904 is not present in the stage of fabrication 1000-2, such that the excess dielectric material 1004 of the conformal dielectric layer 1002 is only formed over the gate channel opening 902.

Figure 11A:
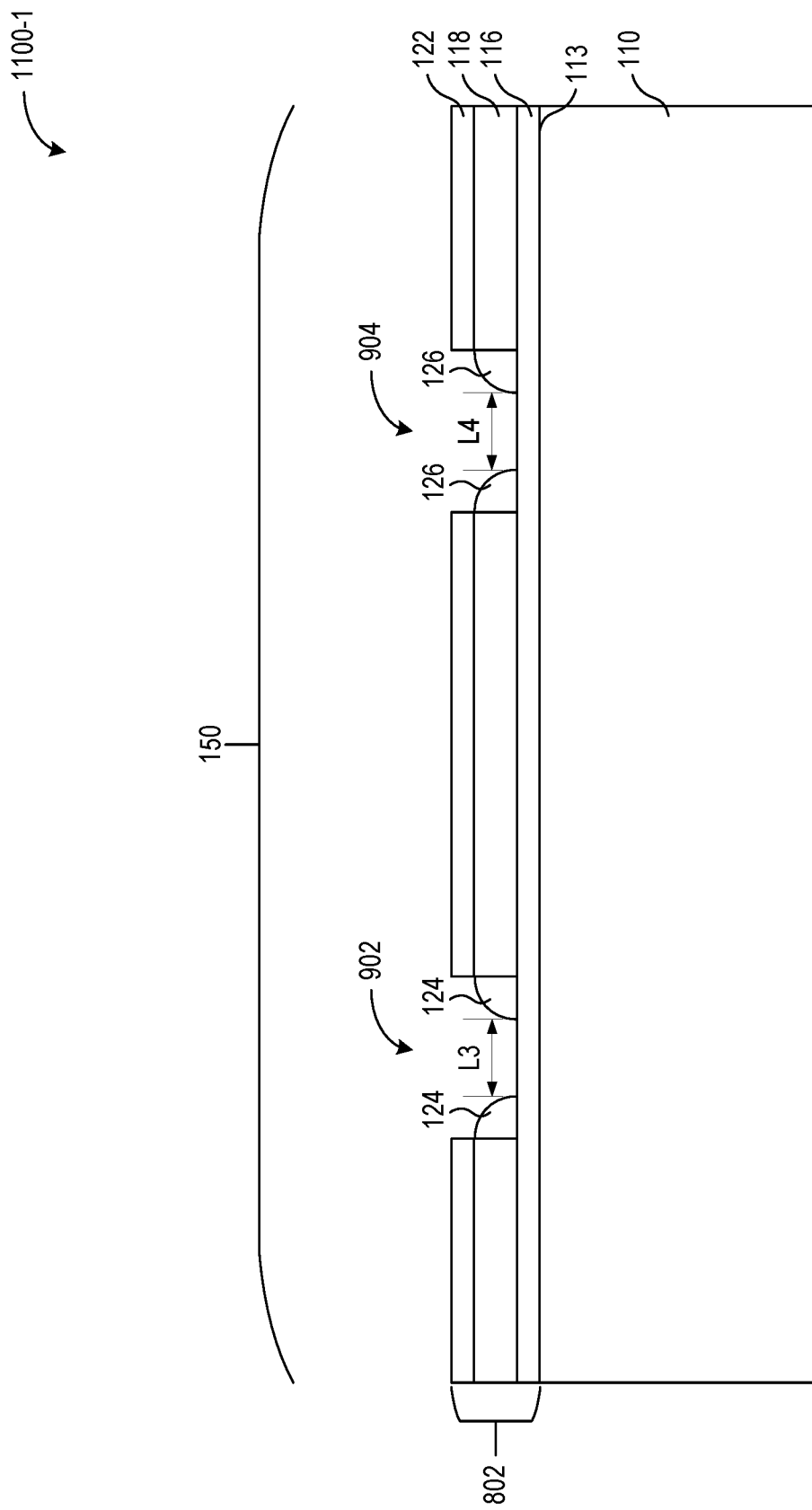
Figure 11B:
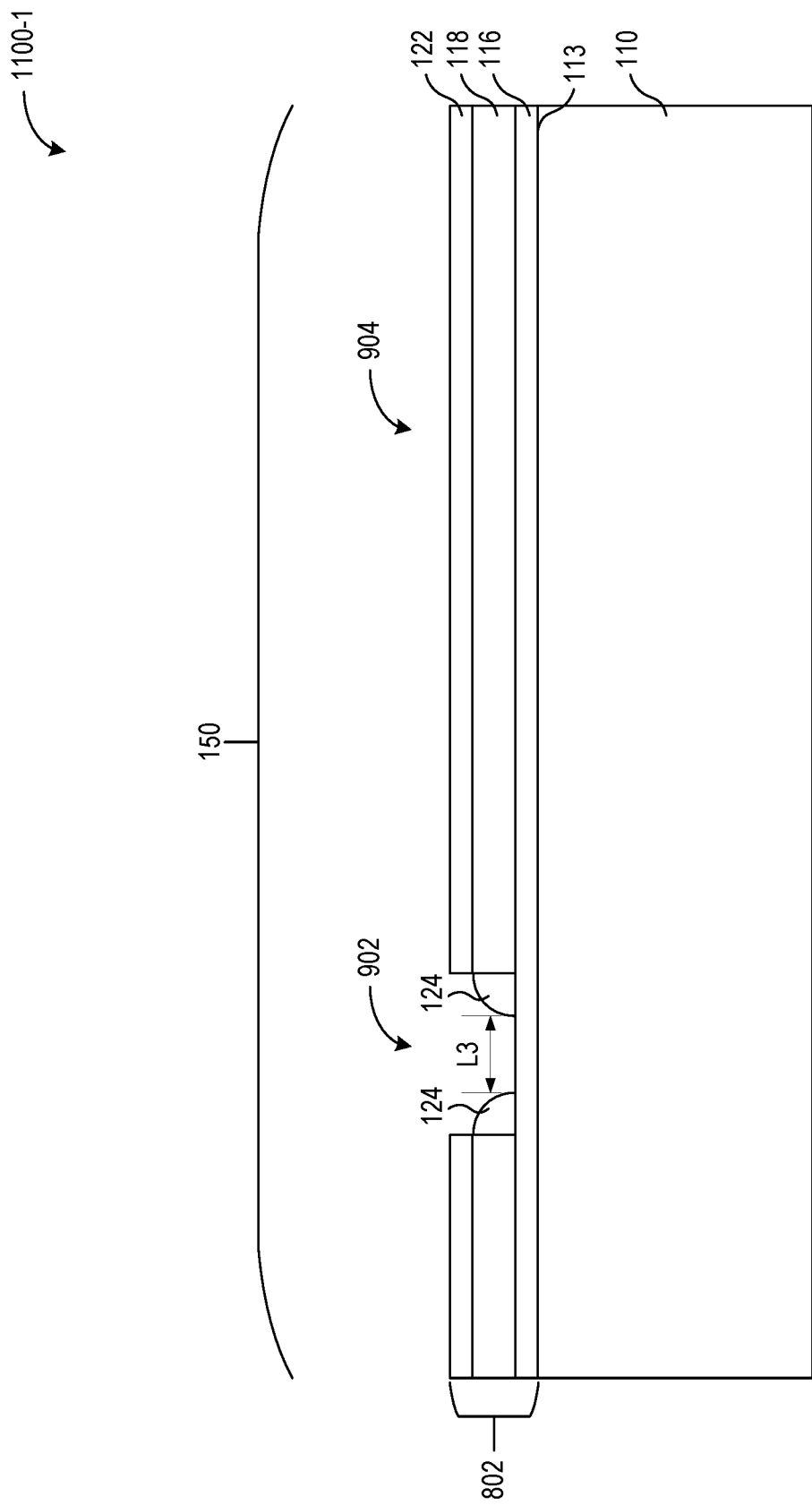

FIGS. 11A and 11B show respective stages of fabrication 1100-1, 1100-2 corresponding to the formation of one or more sets of dielectric spacers via etching the conformal dielectric layer 1002. The stage of fabrication 1100-1 of FIG. 11A may correspond to a stage of fabrication of either of the transistor device 100-1 of FIG. 1A and the transistor device 100-5 of FIG. 1E. The stage of fabrication 1100-2 of FIG. 11B may correspond to a stage of fabrication of any of the transistor device 100-2 of FIG. 1B, the transistor device 100-3 of FIG. 1C, and the transistor device 100-4 of FIG. 1D.

Referring to steps 210 and 610 of FIGS. 2 and 6 and to FIG. 11A, during a stage of fabrication 1100-1, an unpatterned etch (e.g., anisotropic dry etch) may be performed to remove the majority of the conformal dielectric layer 1002. Some portions of the conformal dielectric layer 1002 are not removed during the unpatterned etch. For example, due to the increased thickness of the conformal dielectric layer 1002 in regions that include the excess dielectric material 1004, portions of the conformal dielectric layer 1002 in these thicker regions may remain when all dielectric material of the conformal dielectric layer 1002 in thinner regions has been etched away. Dielectric spacers 124 in the gate channel opening 902 and dielectric spacers 126 in the field plate channel opening 904, are formed from these portions of the conformal dielectric layer 1002 that remain following the unpatterned etch, in the present example. The dielectric spacers 124 may be disposed on the first dielectric layer 116 and adjacent to (and in contact with) portions of the second dielectric layer 118 corresponding to sidewalls of the gate channel opening 902. The dielectric spacers 126 may be disposed on the first dielectric layer 116 and adjacent to (and in contact with) portions of the second dielectric layer 118 corresponding to sidewalls of the field plate channel opening 904. The distance between the dielectric spacers 124 may be characterized by a third length L3. The distance between the dielectric spacers 126 may be characterized by a fourth length L4. The third length L3 may be smaller than the first length L1 (e.g., such that the dielectric spacers 124 narrow at least a portion of the gate channel opening 902). The fourth length L4 may be smaller than the second length L2 (e.g., such that the dielectric spacers 126 narrow at least a portion of the field plate channel opening 904).

Because the dielectric spacers 124 and the dielectric spacers 126 correspond to portions of the conformal dielectric layer 1002, they include the dielectric material of the conformal dielectric layer 1002. In some embodiments, the dielectric spacers 124 and the dielectric spacers 126 may include the same dielectric material as that of the second dielectric layer 118 (e.g., SiN) or another dielectric material having a similar etch rate (i.e., low etch selectivity) with respect to that of the dielectric material of the second dielectric layer 118. In some embodiments, the dielectric spacers 124 and the dielectric spacers 126 include dielectric material having a different etch rate (i.e., high etch selectivity) with respect to that of the dielectric material of the first and third dielectric layers 116, 122.

The dielectric spacers 124 may desirably (in some applications) reduce a gate length of the transistor 101. Transistors having smaller gate lengths typically have faster switching speeds, and are, therefore, advantageous for use in high frequency applications. Further, conventional photolithographic equipment and processes are limited with respect to their smallest achievable feature size (e.g., gate length). Reducing the gate length of the transistor 101 using the dielectric spacers 124 may advantageously improve the switching speed of the transistor 101 and may overcome such limitations of conventional photolithographic equipment and processes.

The dielectric spacers 126 may reduce the size of field plate metal formed in the field plate channel opening 904 or may be removed in a subsequent processing step. Because the dielectric spacers 126 may selectively be kept or removed during fabrication of the transistor 101, design flexibility of the transistor 101 (with respect to the size of the field plate) may be improved.

The size of the dielectric spacers 124 and the dielectric spacers 126 may correspond to the thickness of the previously deposited conformal dielectric layer 1002. For example, a thicker conformal dielectric layer 1002 results in larger dielectric spacers 124 and larger dielectric spacers 126, thereby reducing the length L3 (which determines the gate length of the transistor 101) and the length L4 (which determines a dimension of the field plate 132). In contrast, a thinner conformal dielectric layer 1002 results in smaller dielectric spacers 124 and smaller dielectric spacers 126, thereby increasing the length L3 and the length L4. Thus, the gate length of the transistor 101 and at least one dimension of the field plate 132 may be adjusted by adjusting the thickness of the previously formed conformal dielectric layer 1002.

Referring next to steps 310, 410, 510, of FIGS. 3-5 and to FIG. 11B, during a stage of fabrication 1100-2, an unpatterned etch (e.g., anisotropic dry etch) may be performed to remove the majority of the conformal dielectric layer 1002. Some portions of the conformal dielectric layer 1002 (e.g., corresponding to the thicker regions of the conformal dielectric layer 1002 in which the excess dielectric material 1104 is formed in the stage of fabrication 1000-2 of FIG. 10B) are not removed during the unpatterned etch, resulting in the formation of the dielectric spacers 124 in the gate channel opening 902. The distance between the dielectric spacers 124 may be characterized by a length L3 that is shorter than the length L1 between sidewalls of the gate channel opening 902. Some aspects of etching the conformal dielectric layer 1002 at the stage of fabrication 1100-2 may be similar to those described above in connection with the stage of fabrication 1100-1 of FIG. 11A, and corresponding details are not repeated here for sake of brevity. However, it should be noted that the field plate channel opening 904 is not present in the stage of fabrication 1100-2, so dielectric spacers, such as the dielectric spacers 124, are only formed in the gate channel opening 902 in the present example.

Figure 12A:
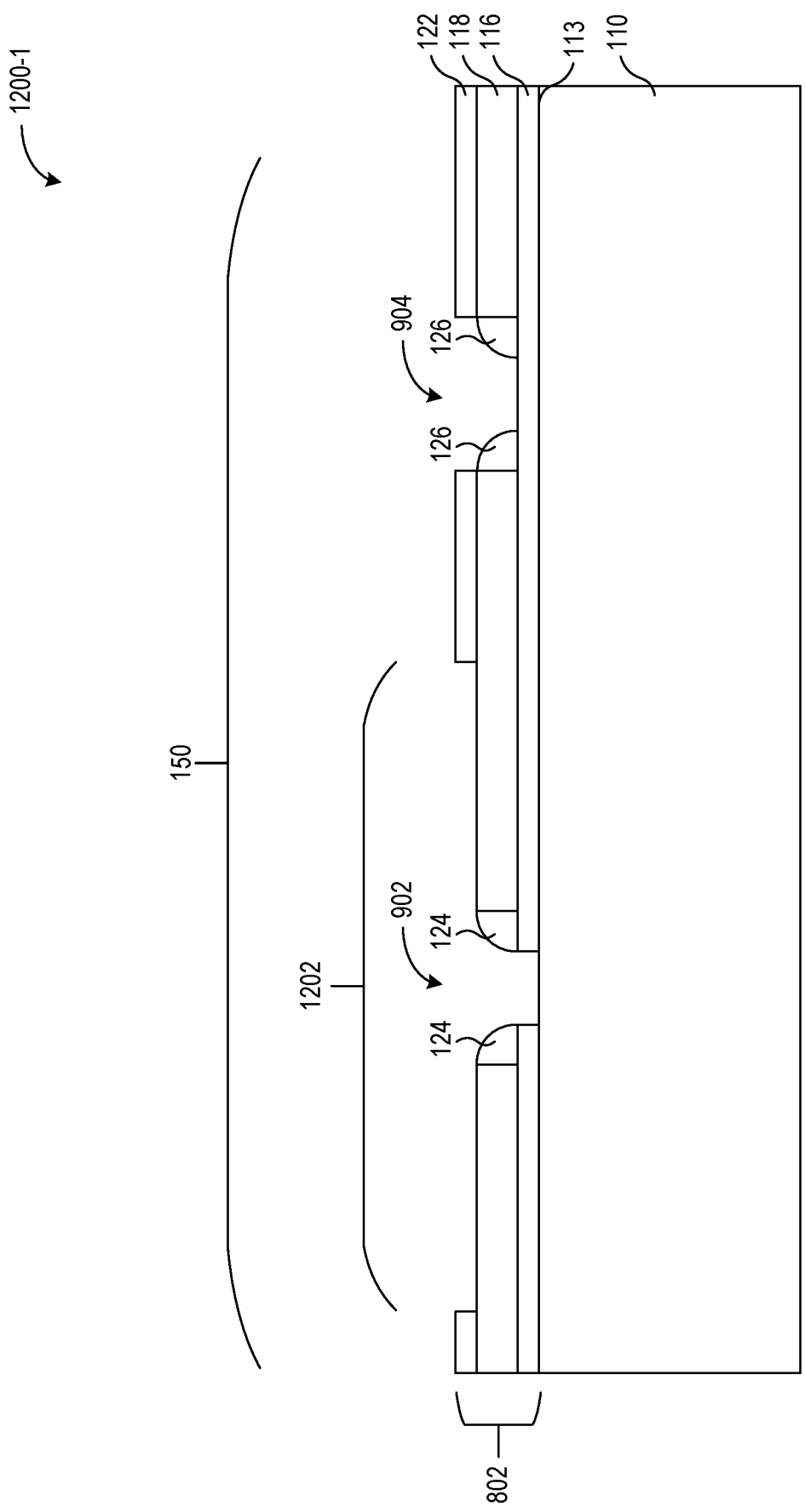
Figure 12B:
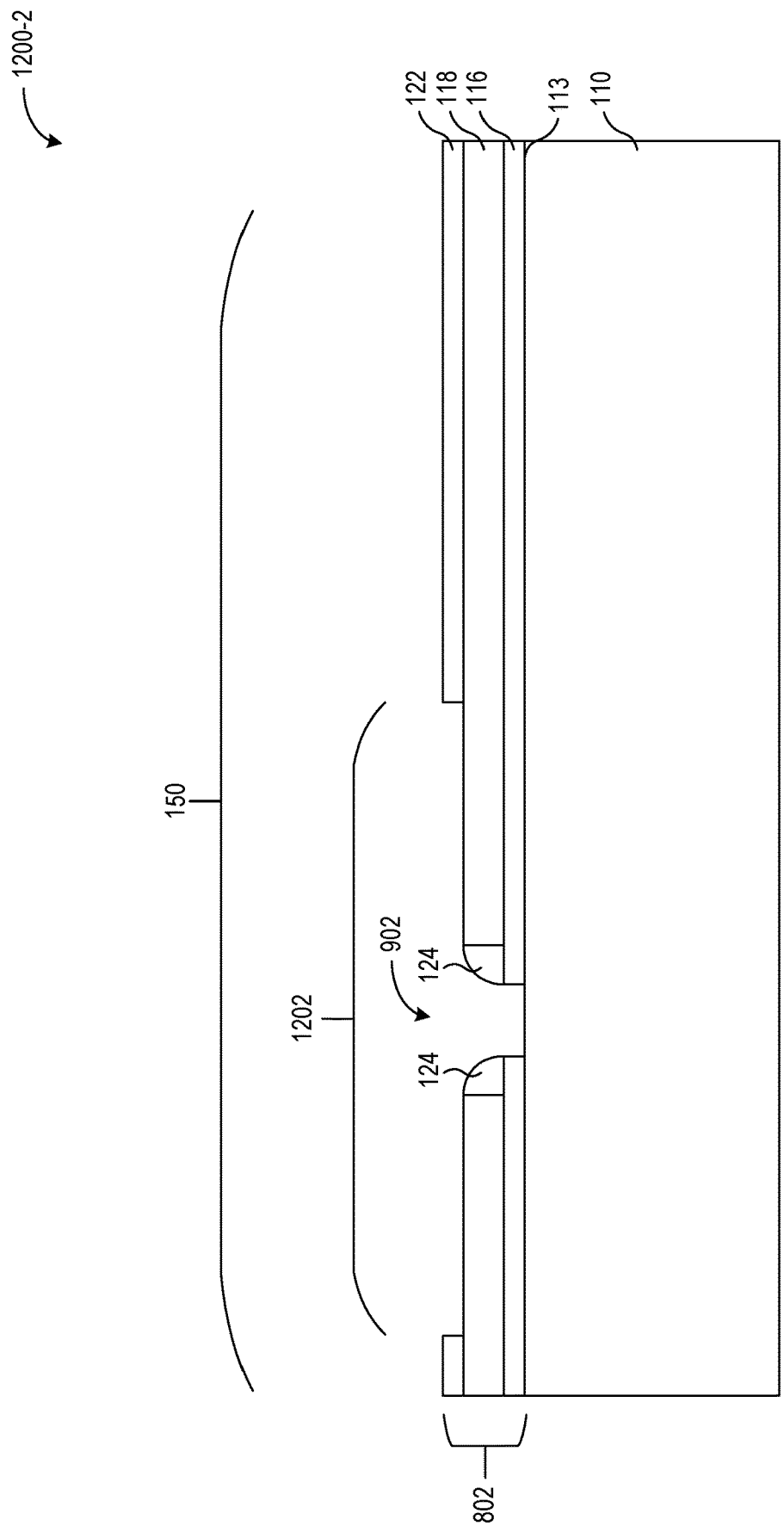

FIGS. 12A-12B show respective stages of fabrication 1200-1, 1200-2 at which one or more layers of the multi-layer dielectric stack 802 are etched following formation of at least the dielectric spacers 124. The stage of fabrication 1200-1 of FIG. 12A may correspond to a stage of fabrication of either of the transistor device 100-1 of FIG. 1A and the transistor device 100-5 of FIG. 1E. The stage of fabrication 1200-2 of FIG. 12B may correspond to a stage of fabrication of any of the transistor device 100-2 of FIG. 1B, the transistor device 100-3 of FIG. 1C, or the transistor device 100-4 of FIG. 1D.

Referring to steps 212 and 612 of FIGS. 2 and 6 and to FIG. 12A, during a stage of fabrication 1200-1, portions of the multi-layer dielectric stack 802 in a gate channel region 1202 are removed via a selective etch process. For example, the portions of the multi-layer dielectric stack 802 that are removed via the selective etch process may include portions of the first dielectric layer 116 and the third dielectric layer 122. The second dielectric layer 118 and the dielectric spacers 124, 126 may have a slower etch rate than the first dielectric layer 116 and the third dielectric layer 122 with respect to a selective etch process used to etch the portions of the multi-layer dielectric stack 802 in the present example. In some embodiments, the selective etch process may use a hydrofluoric acid (HF)-based wet etch process to remove the portions of the first dielectric layer 116 and the third dielectric layer 122.

The portions of the first dielectric layer 116 that are removed via the selective etch process may expose the upper surface 113 of the semiconductor substrate 110 and may extend the gate channel opening 902 through the multi-layer dielectric stack 802. A dimension of the exposed portion of the surface 113 in the gate channel opening 902 may correspond to the third length L3 since portions of the first dielectric layer 116 between the dielectric spacers 124 are not exposed during the selective etch process of the stage of fabrication 1200 (with the possible exception of some undercutting). That is, the size of the portion of the exposed portion of the surface 113 of the gate channel opening 902 may be at least partially defined by the distance between the dielectric spacers 124.

Referring next to steps 312, 412, 512 of FIGS. 3, 4, and 5 and to FIG. 12B, during a stage of fabrication 1200-2, portions of the multi-layer dielectric stack 802 in a gate channel region 1202 are removed via a selective etch process. Some aspects of etching the portions of the multi-layer dielectric stack 802 in the gate channel region 1202 at the stage of fabrication 1200-2 may be similar to those described above in connection with the stage of fabrication 1200-1 of FIG. 12A, and corresponding details are not repeated here for sake of brevity. It should be noted that the field plate channel opening 904 is not present in the stage of fabrication 1200-2.

Figure 13A:
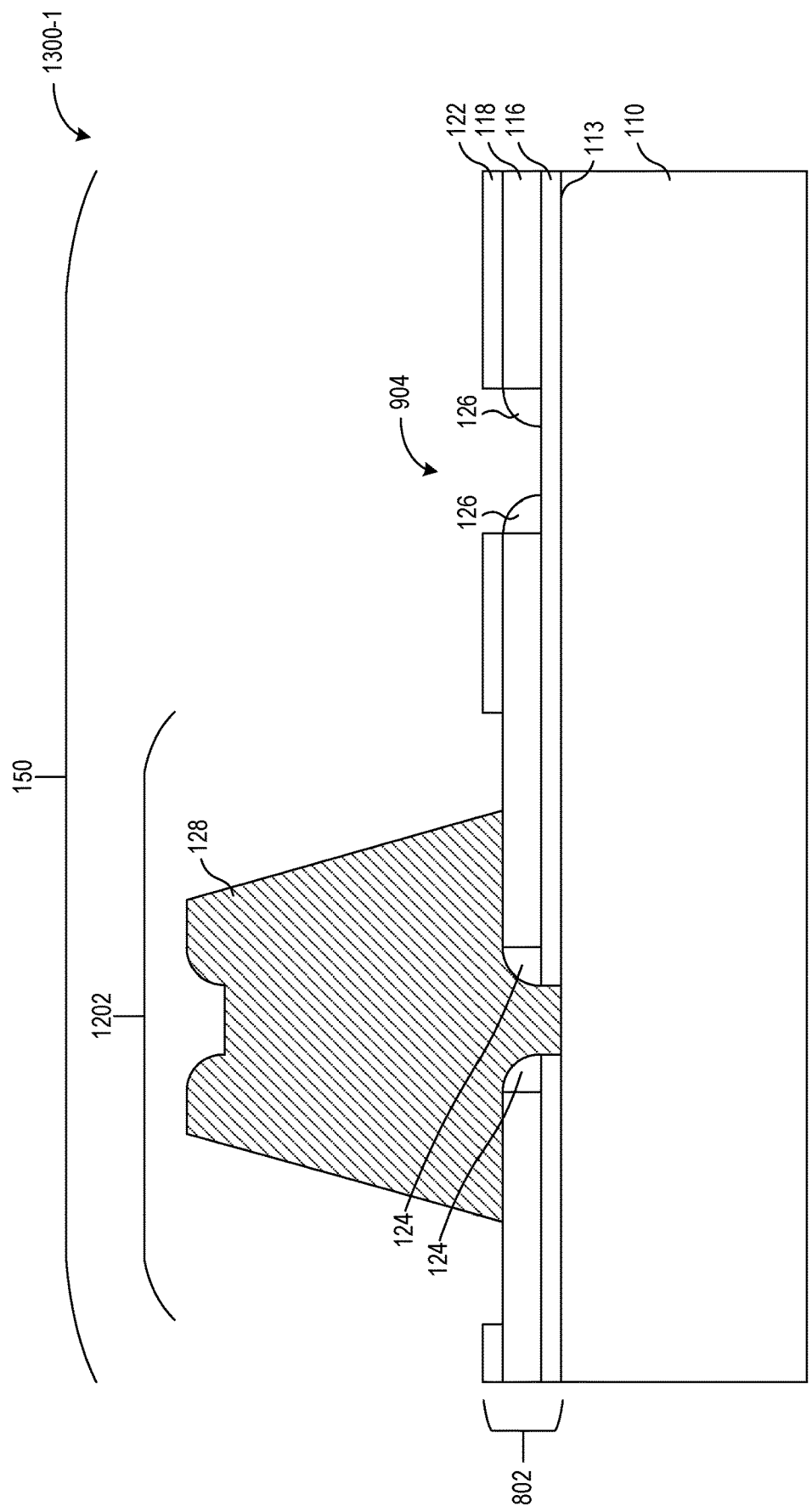
Figure 13B:
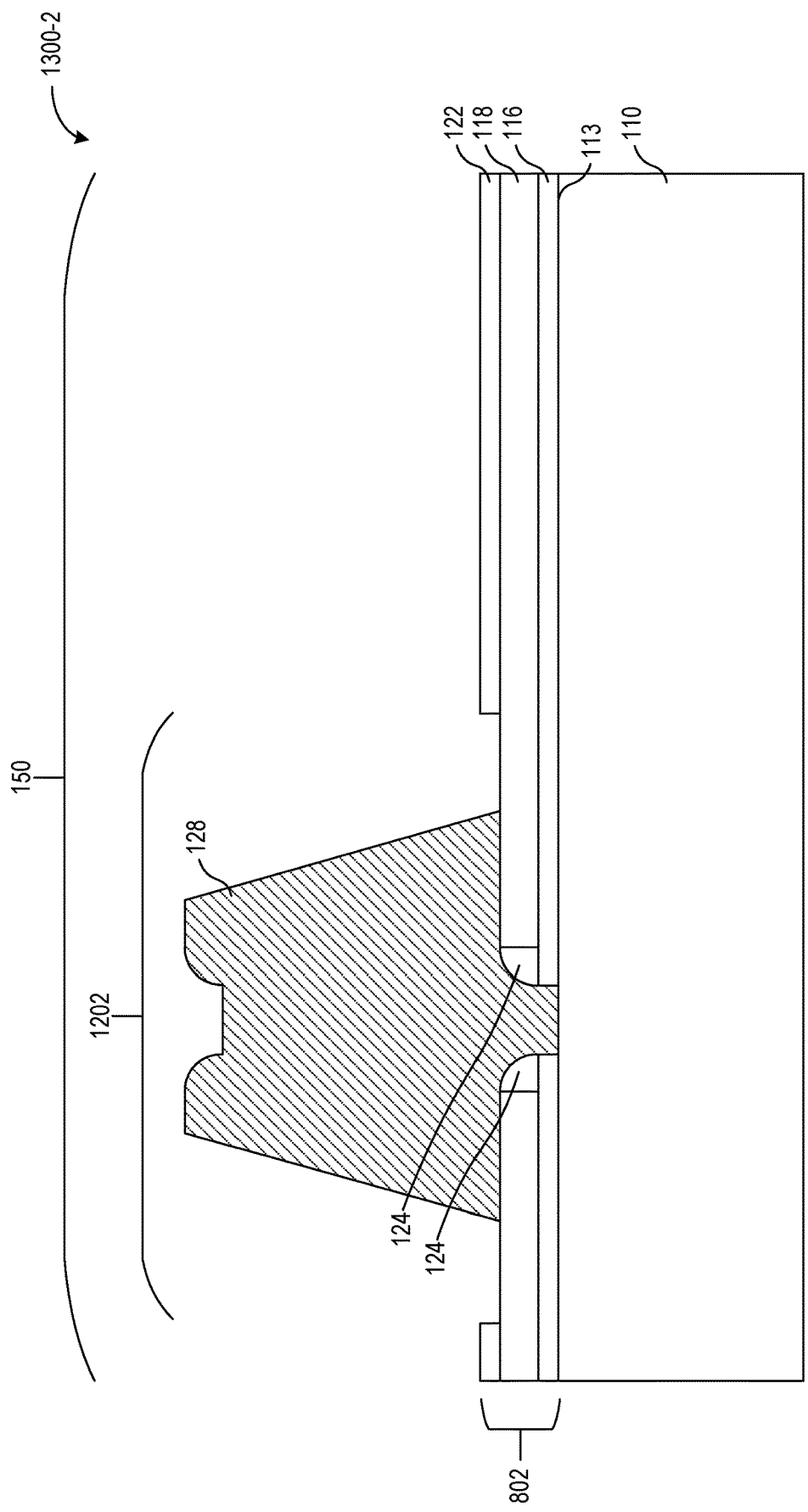

FIGS. 13A-13B show respective stages of fabrication 1300-1, 1300-2 at which a gate electrode of a gate structure is formed in the gate channel region 1202. The stage of fabrication 1300-1 of FIG. 13A may correspond to a stage of fabrication of either of the transistor device 100-1 of FIG. 1A and the transistor device 100-5 of FIG. 1E. The stage of fabrication 1300-2 of FIG. 13B may correspond to a stage of fabrication of any of the transistor device 100-2 of FIG. 1B, the transistor device 100-3 of FIG. 1C, or the transistor device 100-4 of FIG. 1D.

Referring to steps 214 and 614 of FIGS. 2 and 6 and to FIG. 13A, during a stage of fabrication 1300-1, a gate structure, including a gate electrode 128 (e.g., "control electrode"), may be formed over the substrate 110 in the gate channel region 1202 of the active region 150. The gate electrode 128 may be electromagnetically coupled to the channel 108 through the upper surface 113 of the substrate 110 and the barrier layer 112. During operation of the transistor device 100, changes to the electric potential on gate electrode 128 may shift the quasi-Fermi level for the barrier layer 112 compared to the quasi-Fermi level for the channel layer 106 and thereby modulate the electron concentration in the channel 108 within the portion of the substrate 110 under the gate electrode 128.

In an embodiment, the gate electrode 128 may be configured as a Schottky gate and may be formed over and directly in contact with the upper substrate surface 113 using a Schottky material layer and a conductive metal layer. More specifically, Schottky or other suitable materials may be combined with highly conductive materials in a metal stack to form gate electrode 128, according to an embodiment. For example, a Schottky material layer may first be formed in contact with the substrate 110, and a conductive low-stress metal may be deposited over the Schottky material layer to form the gate electrode 128, according to an embodiment. In other embodiments, the gate electrode 128 may be formed over a gate dielectric or gate oxide (not illustrated) on the upper surface 113 of the substrate 110, thus forming a metal-insulator-semiconductor (MIS) junction or metal oxide semiconductor (MOS) junction, which may be electrically coupled to the channel 108 through the gate dielectric or gate oxide layer.

The gate electrode 128 may have a T-shaped cross section, as shown in the present example, with a vertical stem over the substrate 110 that passes through the first dielectric layer 116 and the second dielectric layer 118 of the multi-layer dielectric stack 820, and a wider portion over the vertical stem that has horizontal portions that overlie and contact the upper surface of the second dielectric layer 118 and the dielectric spacers 124, according to an embodiment. In other embodiments (not shown), the gate electrode 128 may have a square or rounded cross-sectional shape. In other embodiments, the vertical stem or lower portion of the gate electrode 128 may be recessed through the upper surface 113 of the semiconductor substrate 110 and may extend partially into the barrier layer 112, increasing the electrical coupling of gate electrode 128 to channel 108 through the barrier layer 112. The gate metal comprising all or part of the gate electrode 128 may be deposited by evaporation, sputtering, or another suitable process.

In some embodiments, ohmic contact metals, such as those of the source and drain electrodes 134, 136, are not deposited until after formation of the gate electrode 128. For example, by forming the ohmic contact metals after forming the gate electrode 128, the number of processing steps used to form the transistor 101 may be advantageously reduced. In other embodiments, such ohmic contact metals are deposited before formation of the gate electrode 128. For example, forming the ohmic contact metals before formation of the gate electrode 128 avoids exposing the gate metal to high temperatures that may be used when forming the ohmic contact metals, which may otherwise degrade the gate electrode 128 if the gate electrode 128 is not formed from material that can tolerate such high temperatures.

Referring next to steps 314, 414, 514 of FIGS. 3, 4, and 5 and to FIG. 13B, during a stage of fabrication 1300-2, the gate electrode 128 may be formed in the gate channel region 1202. Some aspects of forming the gate electrode 128 in the gate channel region 1202 at the stage of fabrication 1300-2 may be similar to those described above in connection with the stage of fabrication 1300-1 of FIG. 13A, and corresponding details are not repeated here for sake of brevity. It should be noted that the field plate channel opening 904 is not present in the stage of fabrication 1300-2.

Figure 14A:
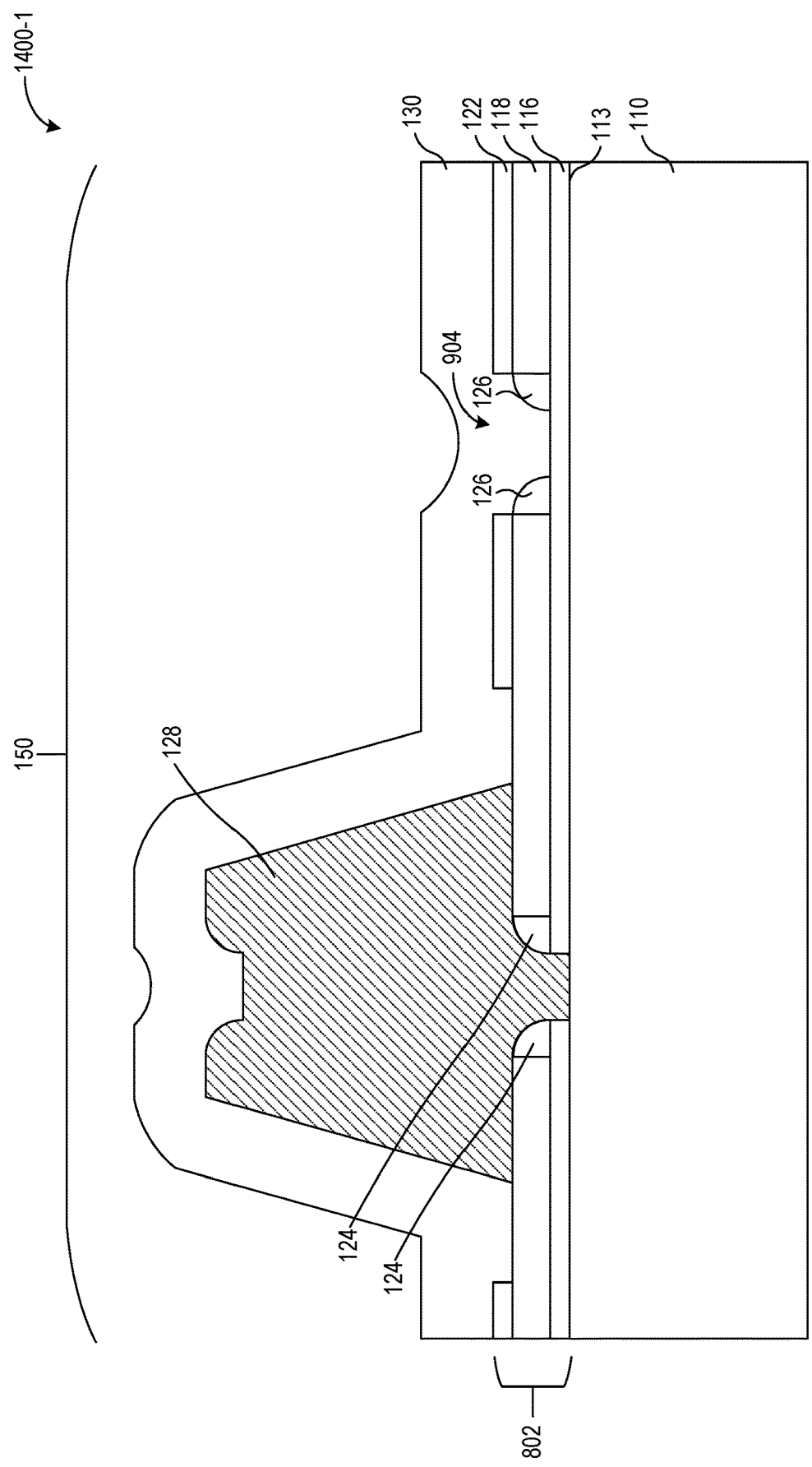
Figure 14B:
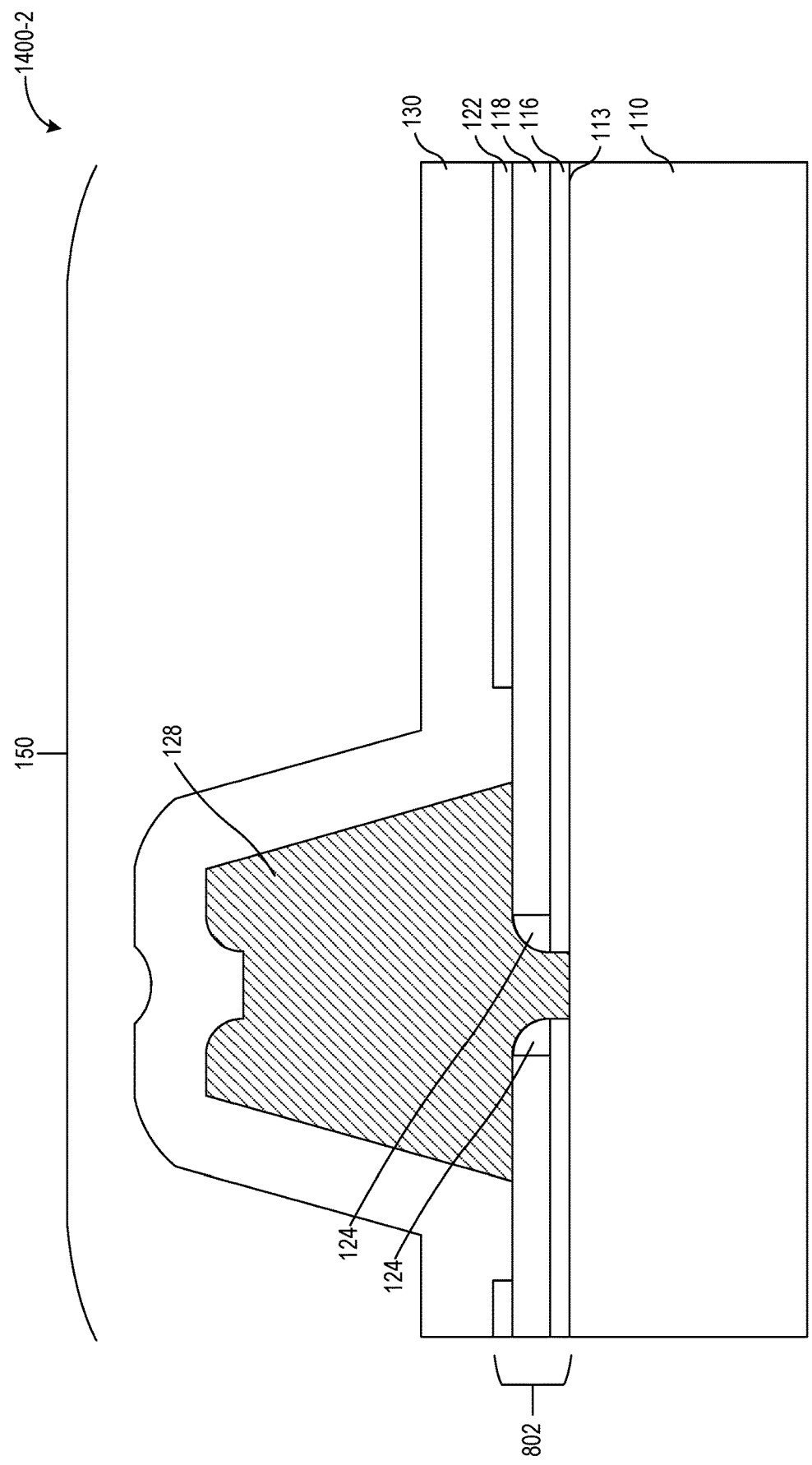

FIGS. 14A-14B show respective stages of fabrication 1400-1, 1400-2, at which an interlayer dielectric (ILD) layer may be formed over the multi-layer dielectric stack 802 and the gate electrode 128. The stage of fabrication 1400-1 of FIG. 14A may correspond to a stage of fabrication of either of the transistor device 100-1 of FIG. 1A and the transistor device 100-5 of FIG. 1E. The stage of fabrication 1400-2 of FIG. 14B may correspond to a stage of fabrication of any of the transistor device 100-2 of FIG. 1B, the transistor device 100-3 of FIG. 1C or the transistor device 100-4 of FIG. 1D.

Referring to steps 216 and 616 of FIGS. 2 and 6 and to FIG. 14A, during a stage of fabrication 1400-1, an ILD layer 130 may be formed (e.g., deposited) over the multi-layer dielectric stack 802 and the gate electrode 128. According to various embodiments, upon being formed, the ILD layer 130 may directly contact one or more of the gate electrode 128, the third dielectric layer 122, the second dielectric layer 118, the first dielectric layer 116, and the dielectric spacers 126. In some embodiments, the ILD layer 130 has a thickness in a range of about 500 angstroms to about 10,000 angstroms, although the ILD layer 130 may be thinner or thicker, as well. The ILD layer 130 may be formed from silicon nitride, silicon oxide, silicon oxynitride or other suitable dielectric materials. In some embodiments, the ILD layer 130 may be formed from material having an etch rate (with respect to an etch process used to etch the ILD layer 130 in a subsequent processing step) that is faster than that of the material from which the first dielectric layer 116 and the third dielectric layer 122 are formed.

In some embodiments, the ILD layer 130 may be formed from material that is the same as or that has a similar etch rate to that of the material of the dielectric spacers 126 (e.g., SiN) that are disposed in the field plate channel opening 904. In one or more such embodiments, when the portion of the ILD layer 130 over the field plate channel opening 904 is etched (i.e., in a subsequent processing step, described below), the dielectric spacers 126 are also removed.

In other embodiments, the ILD layer 130 may be formed from material that has a different etch rate (e.g., a faster etch rate) from that of the material of the dielectric spacers 126 that are disposed in the field plate channel opening 904. In one or more such embodiments, when the portion of the ILD layer 130 over the field plate channel opening 904 is etched (i.e., in a subsequent processing step, described below), the dielectric spacers 126 are not removed.

Referring next to steps 316, 416, 516 of FIGS. 3, 4, and 5 and to FIG. 14B, during a stage of fabrication 1400-2 the ILD layer 130 may be formed over the gate electrode 128 and the multi-layer dielectric stack 802. Some aspects of forming the ILD layer 130 at the stage of fabrication 1400-2 may be similar to those described above in connection with the stage of fabrication 1400-1 of FIG. 14A, and corresponding details are not repeated here for sake of brevity. It should be noted that the field plate channel opening 904 is not present in the stage of fabrication 1400-2.

FIGS. 15A-15C show respective stages of fabrication 1500-1, 1500-2, 1500-3 at which a portion of the interlayer dielectric (ILD) layer in a field plate region 1502 (sometimes referred to as the "field plate channel region") may be selectively etched. The stage of fabrication 1500-1 of FIG. 15A may correspond to a stage of fabrication of either of the transistor device 100-1 of FIG. 1A and the transistor device 100-5 of FIG. 1E. The stage of fabrication 1500-2 of FIG. 15B may correspond to a stage of fabrication of the transistor device 100-2 of FIG. 1B. The stage of fabrication 1500-3 of FIG. 15C may correspond to a stage of fabrication the transistor device 100-3 of FIG. 1C.

Referring to steps 218 and 618 of FIGS. 2 and 6 and to FIG. 15A, during a stage of fabrication 1500-1, an etch process may be performed to selectively remove portions of the ILD layer 130 in a field plate region 1502. For example, the etch process may be an anisotropic dry etch process, such as a RIE process. The field plate region 1502 may overlap or include the field plate channel opening 904, such that portions of the ILD layer 130 disposed in the field plate channel opening 904 are removed during the etch process used to selectively remove the portions of the ILD layer 130. In embodiments in which the dielectric spacers 126 have an etch rate similar to that of the ILD layer 130 (with respect to the etch process used to form the opening in the ILD layer 130 in the field plate region 1502), the etch process removes the dielectric spacers 126, thereby widening the field plate channel opening 904. In embodiments in which the dielectric spacers have a slower etch rate than that of the ILD layer 130 (with respect to the etch process used to form the opening in the ILD layer 130 in the field plate region 1502), the dielectric spacers 126 remain in the field plate channel opening 904 following the etch process. In this way, dimensions of the portion of the field plate 132 that contacts the first dielectric layer 116 of the multi-layer dielectric stack 802 may be determined, at least in part, based on the respective materials used to form the ILD layer 130 and the dielectric spacers 126, which may improve the design flexibility of the transistor 101 of the transistor device 100. In some embodiments, a portion of the first dielectric layer 116 (e.g., in the region 149 of FIGS. 1E and 17E) may be additionally etched at the stage of fabrication 1500-1 and step 618.

Referring next to step 318 of FIG. 3 and to FIG. 15B, during a stage of fabrication 1500-2, the ILD layer 130 and a portion of the third dielectric layer 122 in the field plate region 1502 are etched such that a portion of the second dielectric layer 118 in the field plate region 1502 is exposed. Some aspects of etching the ILD layer 130 at the stage of fabrication 1500-2 may be similar to those described above in connection with the stage of fabrication 1500-1 of FIG. 15A, and corresponding details are not repeated here for sake of brevity. However, the etch process used to etch the portions of the ILD layer 130 and the third dielectric layer 122 in the stage of fabrication 1500-2 may have a greater duration than that used in the stage of fabrication 1500-1 of FIG. 15A (e.g., due to the need to etch the additional material of the dielectric layer 122). It should be noted that the field plate channel opening 904 is not present in the stage of fabrication 1500-2.

Referring next to step 418 of FIG. 4 and to FIG. 15C, during a stage of fabrication 1500-3, the ILD layer 130 may be etched in the field plate region 1502 such that a portion of the third dielectric layer 122 is exposed. Some aspects of etching the ILD layer 130 at the stage of fabrication 1500-3 may be similar to those described above in connection with the stage of fabrication 1500-1 of FIG. 15A, and corresponding details are not repeated here for sake of brevity. It should be noted that the opening in the third dielectric layer 122 corresponding to the field plate channel opening 904 is not present in the stage of fabrication 1500-3.

Figure 16:
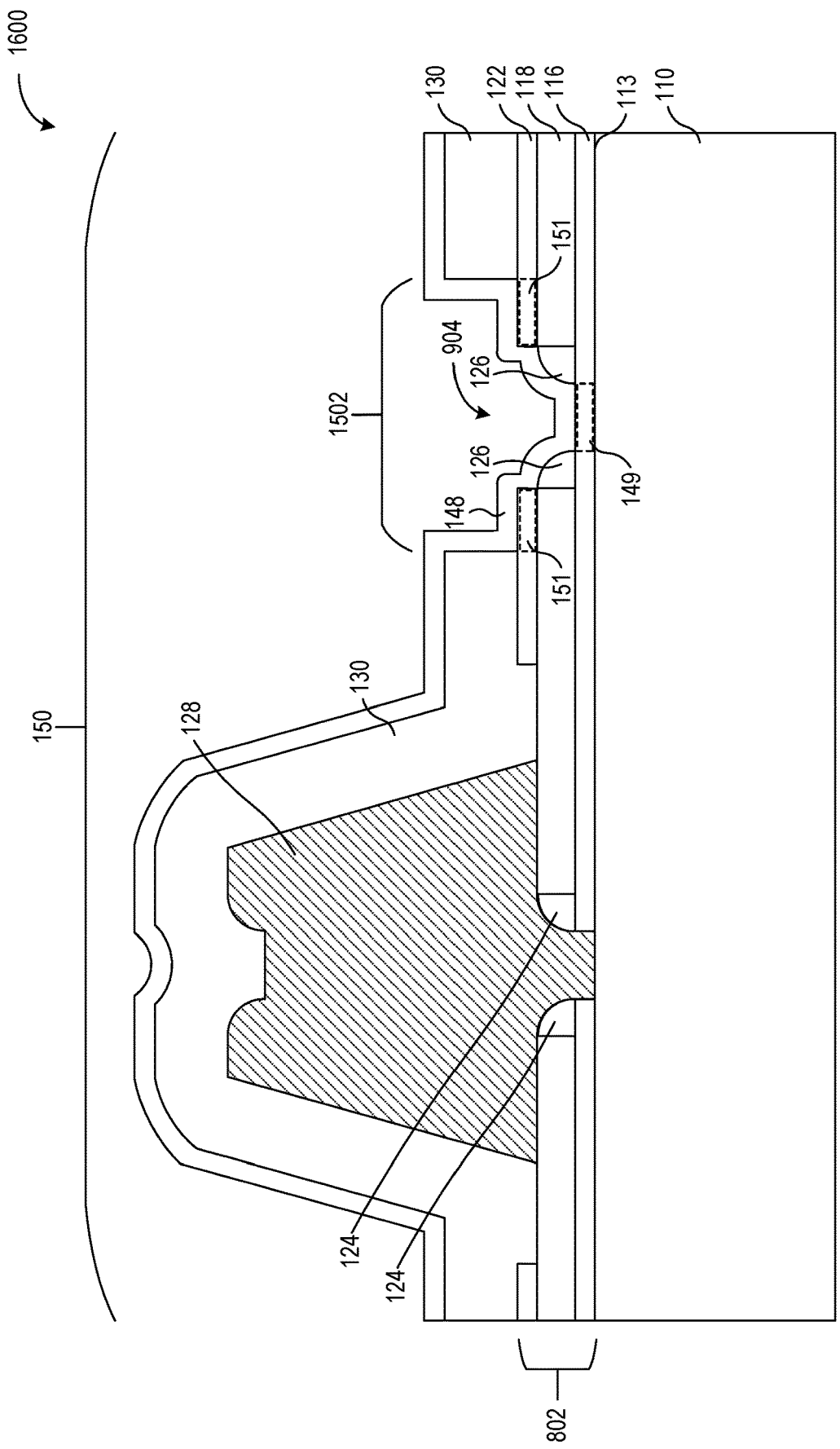

FIG. 16 shows a stage of fabrication 1600 at which a field plate dielectric layer 148 may be formed over the substrate 110, including in the field plate channel opening 904 and the field plate region 1502. The stage of fabrication 1600 may correspond to a stage of fabrication of the transistor device 100-5 of FIG. 1E.

Referring to steps 620 of FIG. 6 and to FIG. 16, during the stage of fabrication 1600, the field plate dielectric layer 148 may be deposited over the substrate 110 In some embodiments, the field plate dielectric layer 148 may be formed over and in contact with the first dielectric layer 116 and the third dielectric layer 122. The field plate dielectric layer 148 may be formed from silicon nitride, silicon oxide, aluminum oxide, silicon oxynitride or other suitable dielectric materials.

In some embodiments, the field plate dielectric layer 148 may be formed over and in contact with portions of the first dielectric layer 116 in the region 149 and portions of the third dielectric layer 122 in the regions 151. In other embodiments, portions of the first dielectric layer 116 in the region 149 and/or portions of the third dielectric layer 122 in the regions 151 may be removed (e.g., during the etch process performed at the stage of fabrication 1500-2 of FIG. 15A or a subsequent etch process), such that portions of the field plate dielectric layer 148 are disposed in the region 149 contacting the upper surface 113 of the substrate 110 and/or portions of the field plate dielectric layer 148 are disposed in the regions 151 contacting an upper surface of the third dielectric layer 122.

By forming the field plate dielectric layer 148 in a separate processing step from the steps in which other dielectric layers of the transistor device 100 (e.g., the transistor device 100-5) are formed, the thickness of the field plate dielectric layer 148 may be more precisely controlled, thereby providing better control over the thickness of dielectric material between the field plate 132 and the upper surface 113 of the substrate 110 when fabricating the transistor device 100. In this way, design flexibility of the transistor device 100 may be desirably improved.

FIGS. 17A-17E show respective stages of fabrication 1700-1, 1700-2, 1700-3, 1700-4, 1700-5 at which a field plate (the field plate 132) may be formed over the substrate 110. While the field plate 132 is formed over the gate electrode 128 in the present example, in some other embodiments, the field plate 132 may be formed having no portion that overlies the gate electrode 128. The stage of fabrication 1700-1 of FIG. 17A may correspond to a stage of fabrication of the transistor device 100-1 of FIG. 1A. The stage of fabrication 1700-2 of FIG. 17B may correspond to a stage of fabrication of the transistor device 100-2 of FIG. 1B. The stage of fabrication 1700-3 of FIG. 17C may correspond to a stage of fabrication of the transistor device 100-3 of FIG. 1C. The stage of fabrication 1700-4 of FIG. 17D may correspond to a stage of fabrication of the transistor device 100-4 of FIG. 1D. The stage of fabrication 1700-5 of FIG. 7E may correspond to the transistor device 100-5 of FIG. 1E.

Figure 17A:
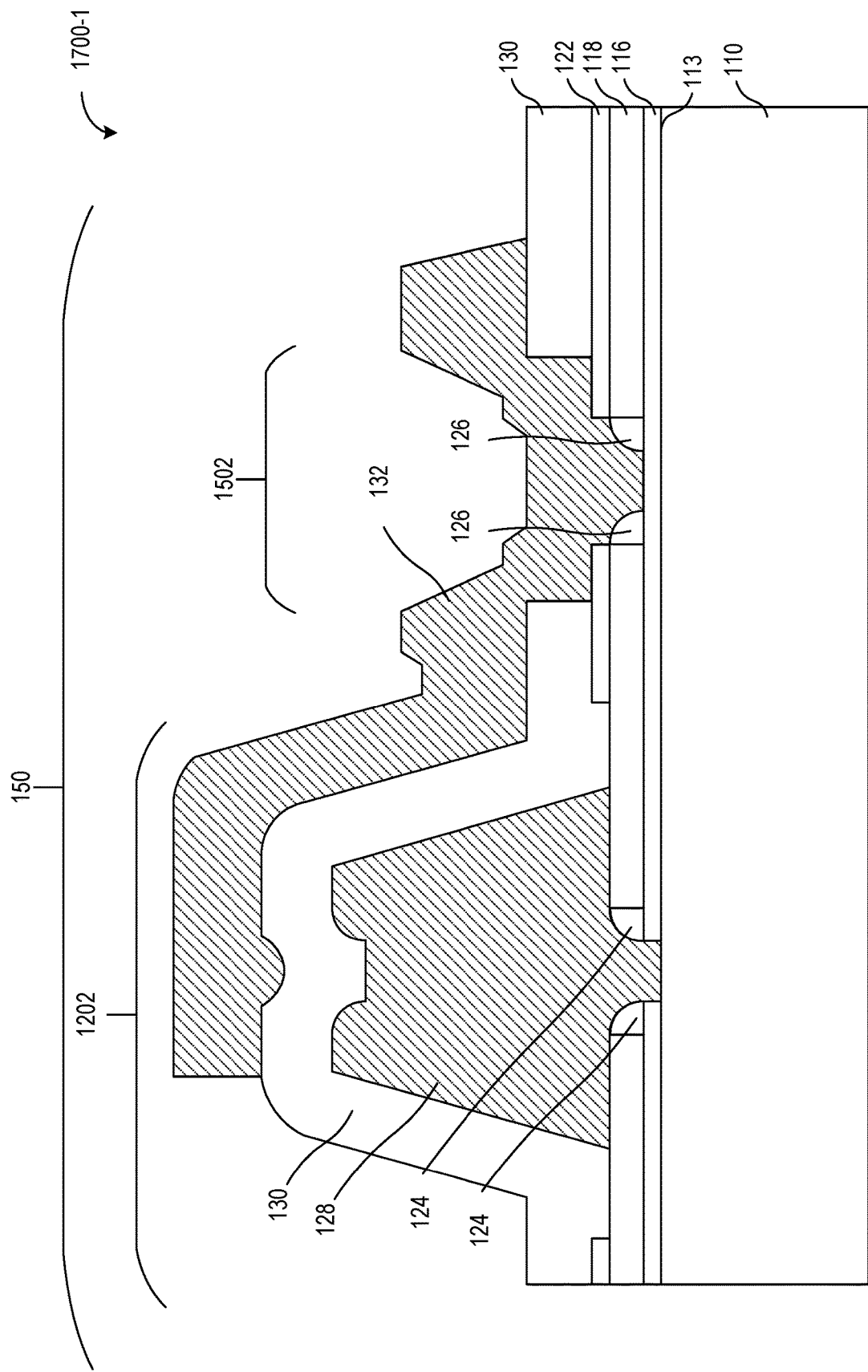

Referring to step 220 of FIG. 2 and to FIG. 17A, during a stage of fabrication 1700-1, a field plate 132 may be formed over and in contact with portions of the first dielectric layer 116 and the third dielectric layer 122 of the multi-layer dielectric stack 802, the dielectric spacers 126 (in embodiments in which the dielectric spacers 126 are not removed when etching the portion of the ILD layer 130 in the field plate region 1502), and portions of the ILD layer 130. In the present example, a minimum thickness of dielectric material between the field plate 132 and the upper surface 113 of the substrate 110 (e.g., in the field plate region 1502) may correspond to a thickness of the first dielectric layer 116.

As shown, at least a portion of the field plate 132 may be disposed in the field plate region 1502, and portions of the field plate 132 may extend beyond this region. In some embodiments, a portion of the field plate 132 may be electrically connected to a source electrode (e.g., the source electrode 134, FIGS. 1A-1E). For example, in some regions of the transistor 101, straps of conductive material (e.g., formed in the region 137 of FIGS. 1A-1E) electrically couple the field plate 132 to the source electrode. In some embodiments, these conductive straps may be formed from the same metal layer as the field plate 132 and may be formed concurrently with formation of the field plate 132. A portion of the field plate 132 may extend over the gate electrode 128 and may be capacitively coupled to the gate electrode 128. The field plate 132 may increase the breakdown voltage of the transistor 101 (e.g., via local modulation of the electric field near the gate electrode 128) and may induce additional source-gate feedback capacitance.

In some embodiments, the field plate 132 may be formed by depositing a conductive layer over the substrate 110, then selectively etching portions of the conductive layer to leave behind portions of the conductive layer that form the field plate 132. In some embodiments, the conductive layer may be formed from a material that is dry-etchable. For example, the conductive layer from which the field plate 132 is formed may be formed from conductive material, such as TiW, TiWN, WSi, or other suitable materials. The conductive layer may have a thickness in a range of about 100 angstroms to about 5000 angstroms, although the conductive layer may be thinner or thicker, as well.

Figure 17B:
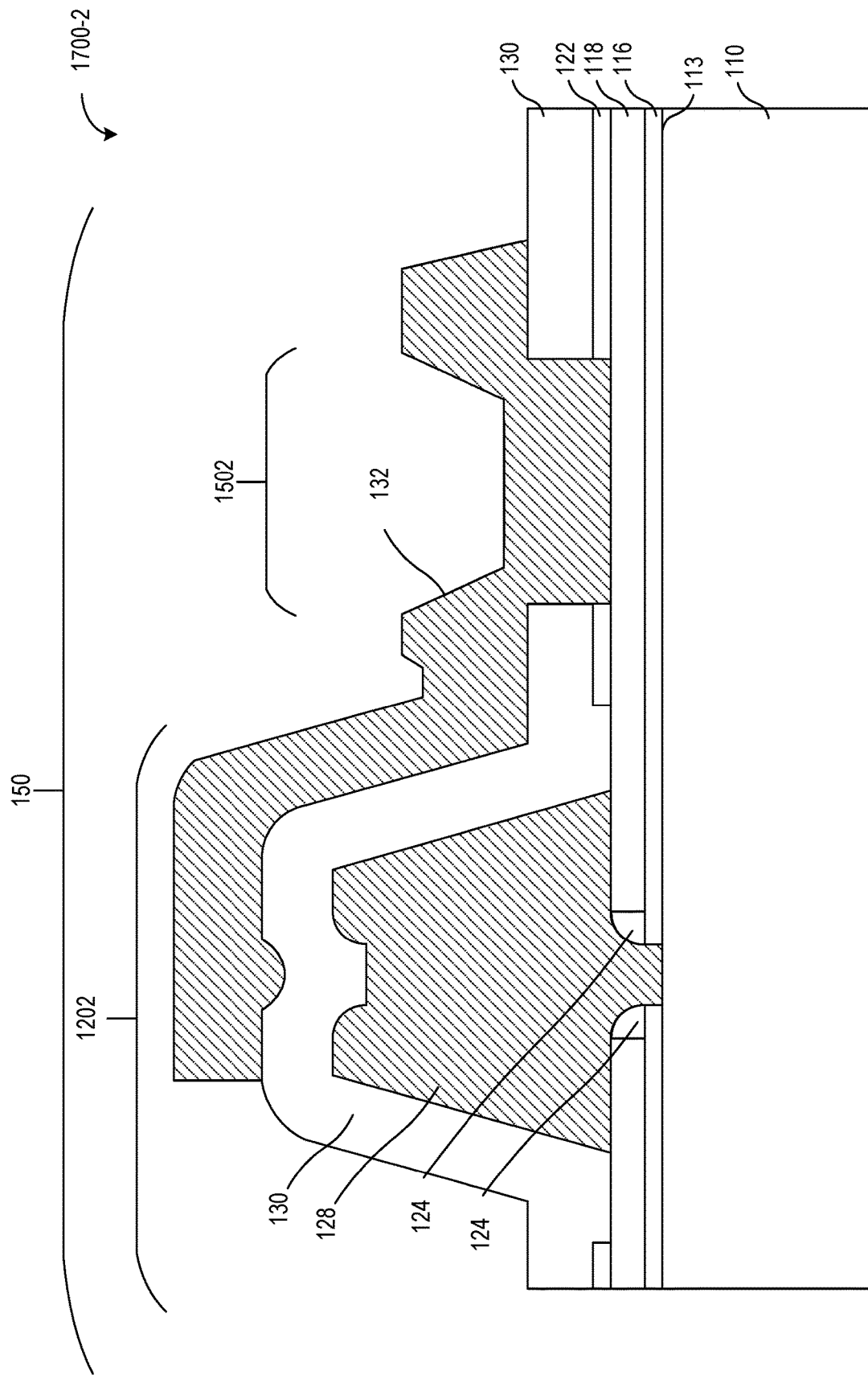

Referring next to step 320 of FIG. 3 and to FIG. 17B, during a stage of fabrication 1700-2, the field plate 132 may be formed over and in contact with portions of the ILD layer 130 and the second dielectric layer 118. At least a portion of the field plate 132 may be disposed in openings in the third dielectric layer 122 and the ILD layer 130. In the present example, a minimum thickness of dielectric material between the field plate 132 and the upper surface 113 of the substrate 110 (e.g., in the field plate region 1502) may correspond to a combined thickness of the first dielectric layer 116 and the second dielectric layer 118. Some aspects of forming the field plate 132 at the stage of fabrication 1700-2 may be similar to those described above in connection with the stage of fabrication 1700-1 of FIG. 17A, and corresponding details are not repeated here for sake of brevity.

Figure 17C:
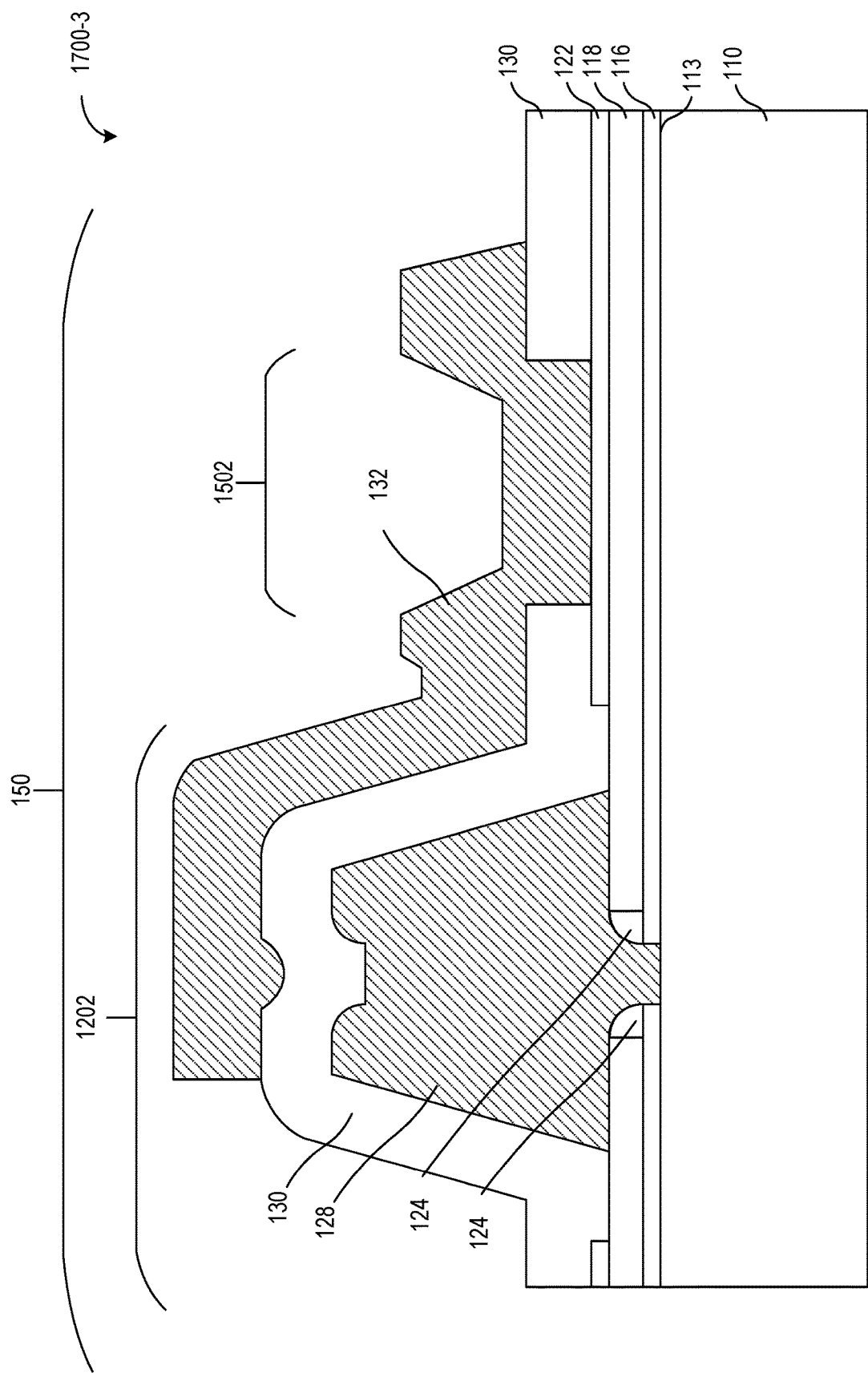

Referring next to step 420 of FIG. 4 and to FIG. 17C, during a stage of fabrication 1700-3, the field plate 132 may be formed over and in contact with portions of the ILD layer 130 and the third dielectric layer 122. At least a portion of the field plate 132 may be disposed in the opening in the ILD layer 130 in the field plate region 1502. In the present example, a minimum thickness of dielectric material between the field plate 132 and the upper surface 113 of the substrate 110 (e.g., in the field plate region 1502) may correspond to a combined thickness of the first dielectric layer 116, the second dielectric layer 118, and the third dielectric layer 122. Some aspects of forming the field plate 132 at the stage of fabrication 1700-3 may be similar to those described above in connection with the stage of fabrication 1700-1 of FIG. 17A, and corresponding details are not repeated here for sake of brevity.

Figure 17D:
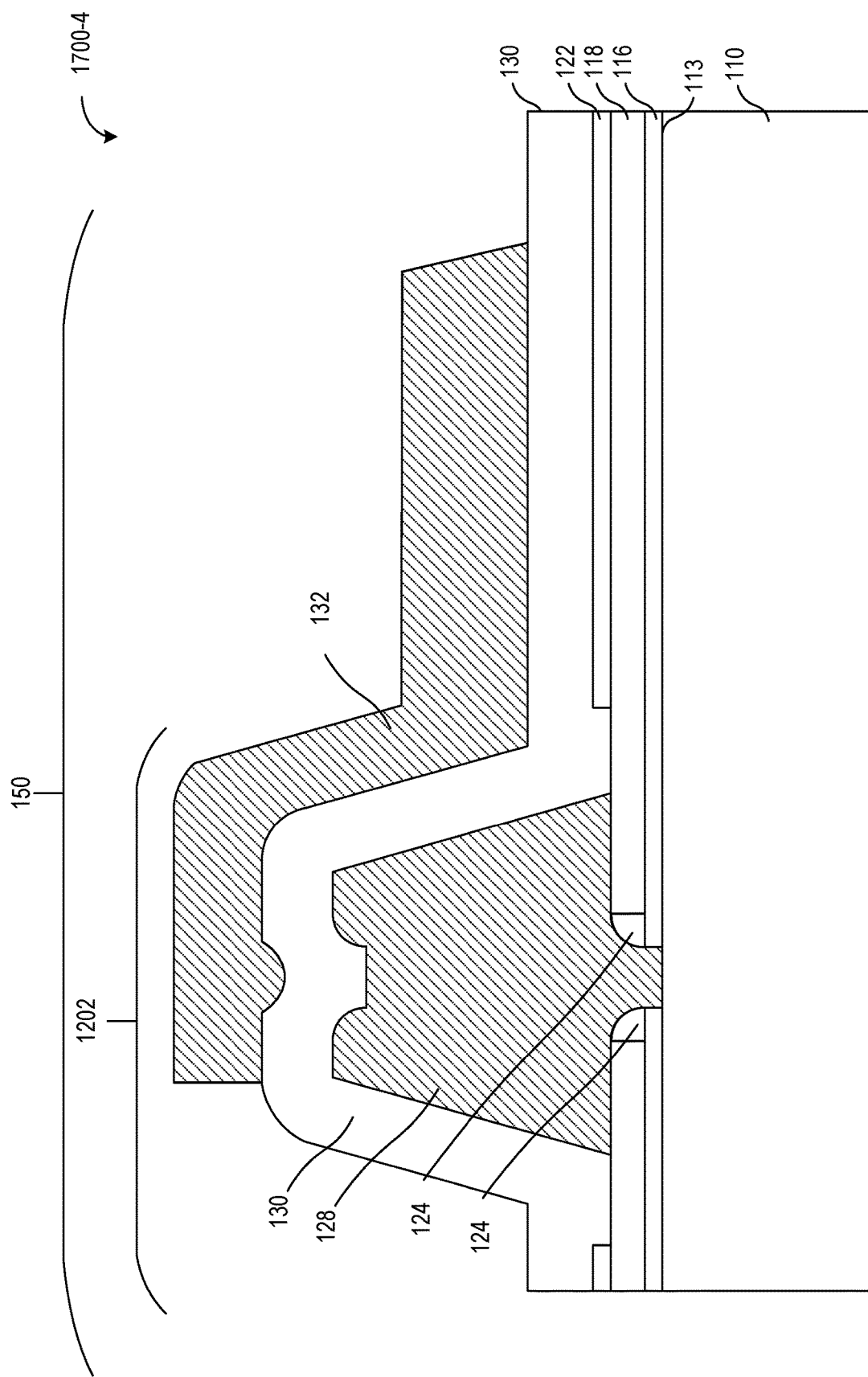

Referring next to step 518 of FIG. 5 and to FIG. 17D, during a stage of fabrication 1700-4, the field plate 132 may be formed over and in contact with portions of the ILD layer 130. In the present example, a minimum thickness of dielectric material between the field plate 132 and the upper surface 113 of the substrate 110 may correspond to a combined thickness of the first dielectric layer 116, the second dielectric layer 118, the third dielectric layer 122, and the ILD layer 130. Some aspects of forming the field plate 132 at the stage of fabrication 1700-4 may be similar to those described above in connection with the stage of fabrication 1700-1 of FIG. 17A, and corresponding details are not repeated here for sake of brevity.

Figure 17E:
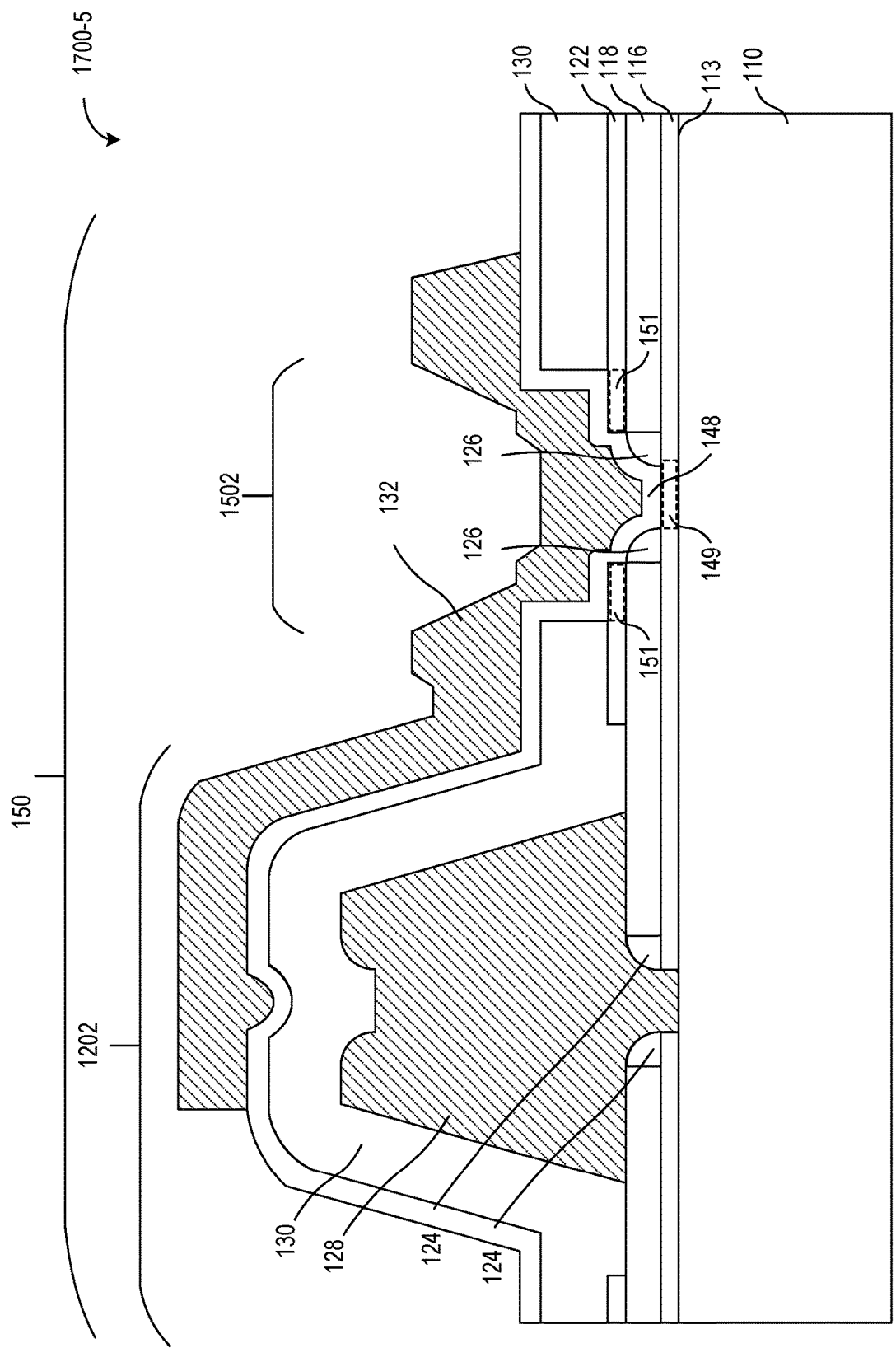

Referring next to step 622 of FIG. 6 and to FIG. 17E, during a stage of fabrication 1700-5, the field plate 132 may be formed over and in contact with portions of the field plate dielectric layer 148. At least a portion of the field plate 132 may be disposed in openings in one or more of the second dielectric layer 118, the third dielectric layer 122, and the ILD layer 130, depending on the thickness of the field plate dielectric layer 148. In some embodiments, a minimum thickness of dielectric material between the field plate 132 and the upper surface 113 of the substrate 110 (e.g., in the field plate region 1502) may correspond to a combined thickness of the first dielectric layer 116 and the field plate dielectric layer 148. In other embodiments (e.g., in which the field plate dielectric layer 148 may be disposed in the region 149), the minimum thickness of dielectric material between the field plate 132 and the upper surface 113 of the substrate 110 (e.g., in the field plate region 1502) may correspond to the thickness of the field plate dielectric layer 148. Some aspects of forming the field plate 132 at the stage of fabrication 1700-5 may be similar to those described above in connection with the stage of fabrication 1700-1 of FIG. 17A, and corresponding details are not repeated here for sake of brevity.

It should be understood that additional processing steps may be performed to complete any of the transistor devices 100-1, 100-2, 100-3, 100-4, 100-5 of FIGS. 1A-1E, including the deposition and patterning of additional dielectric layers (e.g., dielectric layer 138 or other applicable dielectric layers) and metal layers (e.g., the source metallization 135, the interconnect layer 140, or other applicable metal layers).

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transistor device comprising:
   a semiconductor substrate having an upper surface;
   a multi-layer dielectric stack disposed at the upper surface of the semiconductor substrate, wherein the multi-layer dielectric stack includes at least a first dielectric layer, a second dielectric layer, and a third dielectric layer, the second dielectric layer is interposed between the first dielectric layer and the third dielectric layer, and the first dielectric layer and the third dielectric layer each have high etch selectivity with respect to the second dielectric layer;
   a gate electrode at the upper surface of the semiconductor substrate, wherein at least a portion of the gate electrode is disposed in a first channel region in the multi-layer dielectric stack;
   a field plate that is disposed over the semiconductor substrate, adjacent the gate electrode; and
   first dielectric spacers interposed between the portion of the gate electrode and first sidewalls of the first channel region;
   an interlayer dielectric layer disposed over the gate electrode and the multi-layer dielectric stack; wherein the field plate is at least partially disposed in an opening in the interlayer dielectric layer, and wherein the field plate is at least partially disposed in a second channel region in the multi-layer dielectric stack and the opening in the interlayer dielectric layer overlaps the second channel region.

2. The transistor device of claim 1, wherein the field plate is disposed over the interlayer dielectric layer.

3. The transistor device of claim 1, further comprising:
   second dielectric spacers disposed in the second channel region, wherein the second dielectric spacers are each interposed between second sidewalls of the second channel region and a portion of the field plate.

4. The transistor device of claim 3, wherein the second dielectric spacers each have high etch selectivity with respect to the interlayer dielectric layer.

5. The transistor device of claim 1, further comprising:
   a field plate dielectric layer disposed in the second channel region between at least the field plate and the upper surface of the semiconductor substrate.

6. The transistor device of claim 1, wherein the first dielectric layer and the third dielectric layer each include aluminum oxide and the second dielectric layer includes silicon nitride.

7. A method of fabricating a transistor device, the method comprising:
   providing a substrate that includes an upper surface;
   forming a multi-layer dielectric stack on the upper surface of the substrate, the multi-layer dielectric stack including a first dielectric layer, a second dielectric layer, and a third dielectric layer, wherein the second dielectric layer is interposed between the first dielectric layer and the third dielectric layer, the first dielectric layer and the third dielectric layer each have high etch selectivity with respect to the second dielectric layer;
   selectively etching a first region of the multi-layer dielectric stack to form a gate channel opening that extends through at least the second dielectric layer and the third dielectric layer;
   forming first dielectric spacers in the gate channel opening over the first dielectric layer;
   selectively etching a portion of the first dielectric layer such that the gate channel opening extends through the first dielectric layer;
   forming a gate electrode in the gate channel opening;
   forming an interlayer dielectric layer over the gate electrode; and
   forming a field plate over the interlayer dielectric layer, adjacent the gate electrode.

8. The method of claim 7, further comprising:
   etching the interlayer dielectric layer to form an opening in the interlayer dielectric layer, wherein forming the field plate comprises:
      forming the field plate over the interlayer dielectric layer and at least partially in the opening in the interlayer dielectric layer.

9. The method of claim 8, further comprising:
   selectively etching a second region of the multi-layer dielectric stack to form a field plate channel opening that extends through at least the third dielectric layer, wherein forming the field plate comprises:
      forming the field plate over the interlayer dielectric layer, at least partially in the field plate channel opening in the interlayer dielectric layer, and at least partially in the field plate channel opening.

10. The method of claim 9, further comprising:
    forming a field plate dielectric layer in the field plate channel opening prior to forming the field plate.

11. The method of claim 9, further comprising:
    forming second dielectric spacers in the field plate channel opening concurrently with forming the first dielectric spacers in the gate channel opening by:
       forming a conformal dielectric layer over the multi-layer dielectric stack and at least partially in the gate channel opening and the field plate channel opening; and
       etching the conformal dielectric layer, wherein the first dielectric spacers comprise first portions of the conformal dielectric layer remaining in the gate channel opening after etching the conformal dielectric layer, and the second dielectric spacers comprise second portions of the conformal dielectric layer remaining in the field plate channel opening after etching the conformal dielectric layer.

12. The method of claim 11, wherein the first dielectric spacers and the second dielectric spacers each have high etch selectivity with respect to the third dielectric layer.

13. The method of claim 11, wherein the first dielectric spacers and the second dielectric spacers each have high etch selectivity with respect to the interlayer dielectric layer.

14. The method of claim 9, wherein selectively etching the first region of the multi-layer dielectric stack to form a gate channel opening and selectively etching the second region of the multi-layer dielectric stack to form the field plate channel opening comprise:
   performing an anisotropic dry etch process to selectively etch at least the second dielectric layer to form the gate channel opening in the first region of the multi-layer dielectric stack and to form the field plate channel opening in the second region of the multi-layer dielectric stack.

15. The method of claim 7, further comprising:
   forming one or more straps that electrically couple the field plate to a source electrode of the transistor device.

16. The method of claim 7, wherein at least a portion of the gate electrode is interposed between the first dielectric spacers in the gate channel opening and contacts the upper surface of the substrate.

17. The method of claim 7, wherein the first dielectric layer and the third dielectric layer each comprise aluminum oxide and the second dielectric layer comprises silicon nitride.

18. A transistor device comprising:
   a semiconductor substrate having an upper surface;
   a multi-layer dielectric stack disposed at the upper surface of the semiconductor substrate, wherein the multi-layer dielectric stack includes at least a first dielectric layer, a second dielectric layer, and a third dielectric layer, the second dielectric layer is interposed between the first dielectric layer and the third dielectric layer, and the first dielectric layer and the third dielectric layer each have high etch selectivity with respect to the second dielectric layer, wherein the first dielectric layer and the third dielectric layer each include aluminum oxide and the second dielectric layer includes silicon nitride;
   a gate electrode at the upper surface of the semiconductor substrate, wherein at least a portion of the gate electrode is disposed in a first channel region in the multi-layer dielectric stack;
   a field plate that is disposed over the semiconductor substrate, adjacent the gate electrode; and
   first dielectric spacers interposed between the portion of the gate electrode and first sidewalls of the first channel region.

* * * * *